(12) United States Patent
Beiley et al.

(10) Patent No.: US 10,096,730 B2
(45) Date of Patent: Oct. 9, 2018

(54) HIGH-PERFORMANCE IMAGE SENSORS INCLUDING THOSE PROVIDING GLOBAL ELECTRONIC SHUTTER

(71) Applicant: InVisage Technologies, Inc., Menlo Park, CA (US)

(72) Inventors: Zachary Michael Beiley, Oakland, CA (US); Edward Hartley Sargent, Toronto (CA)

(73) Assignee: INVISAGE TECHNOLOGIES, INC., Newark, CA (US)

( * ) Notice: Subject to any disclaimer, the term of this patent is extended or adjusted under 35 U.S.C. 154(b) by 0 days.

(21) Appl. No.: 15/406,696

(22) Filed: Jan. 14, 2017

(65) Prior Publication Data

US 2017/0207355 A1    Jul. 20, 2017

Related U.S. Application Data

(60) Provisional application No. 62/279,611, filed on Jan. 15, 2016.

(51) Int. Cl.
*H01L 31/0352* (2006.01)
*H01L 27/146* (2006.01)
(Continued)

(52) U.S. Cl.
CPC ........ *H01L 31/035218* (2013.01); *H01L 27/14643* (2013.01); *H01L 31/1013* (2013.01);
(Continued)

(58) Field of Classification Search
CPC ....... H01L 31/035218; H01L 27/14643; H01L 31/1013; H01L 31/118; H04N 5/378; H04N 5/353
See application file for complete search history.

(56) References Cited

U.S. PATENT DOCUMENTS 3,789,216 A    1/1974  Komp
5,900,623 A    5/1999  Tsang et al.
(Continued)

FOREIGN PATENT DOCUMENTS

WO    2010082955 A1    7/2010

OTHER PUBLICATIONS

"International Application Serial No. PCT/US2017/013602, International Search Report dated Apr. 7, 2017", 2 pgs.
(Continued)

*Primary Examiner* — Michael Carter
*Assistant Examiner* — Mohammed R Alam
(74) *Attorney, Agent, or Firm* — D. Kligler I.P. Services Ltd.

(57) ABSTRACT

In various embodiments, an electronic device comprises, for example, at least one photosensitive layer and at least one carrier selective layer. Under one range of biases on the device, the photosensitive layer produces a photocurrent while illuminated. Under another range of biases on the device, the photosensitive does not produce a photocurrent while illuminated. A carrier selective layer expands the range of biases over which the photosensitive layer does not produce any photocurrent while illuminated. In various embodiments, an electronic device comprises, for example, at least one photosensitive layer and at least one carrier selective layer. Under a first range of biases on the device, the photosensitive layer is configured to collect a photocurrent while illuminated. Under a second range of biases on the device, the photosensitive layer is configured to collect at least M times lower photocurrent while illuminated compared to under the first range of biases.

11 Claims, 9 Drawing Sheets

(51) Int. Cl.
*H01L 31/101* (2006.01)
*H01L 31/118* (2006.01)
*H04N 5/353* (2011.01)
*H04N 5/378* (2011.01)

(52) U.S. Cl.
CPC ........... *H01L 31/118* (2013.01); *H04N 5/353* (2013.01); *H04N 5/378* (2013.01)

(56) References Cited

U.S. PATENT DOCUMENTS

| | | | |
|---|---|---|---|
| 6,424,375 | B1 | 7/2002 | Fowler et al. |
| 7,609,303 | B1 | 10/2009 | Lee et al. |
| 7,652,706 | B2 | 1/2010 | Xu et al. |
| 7,948,535 | B2 | 5/2011 | Ellis-Monaghan et al. |
| 8,063,350 | B2 | 11/2011 | McGarry et al. |
| 2003/0151050 | A1 | 8/2003 | Fox et al. |
| 2005/0061987 | A1 | 3/2005 | Watadani et al. |
| 2008/0111840 | A1 | 5/2008 | Tsuchi et al. |
| 2009/0152664 | A1 | 6/2009 | Klem et al. |
| 2009/0256156 | A1 | 10/2009 | Hsieh |
| 2010/0014100 | A1 | 1/2010 | Yang et al. |
| 2010/0019334 | A1* | 1/2010 | Ivanov ................. H01L 31/032 257/432 |
| 2010/0051786 | A1 | 3/2010 | Lotto et al. |
| 2010/0149393 | A1 | 6/2010 | Zarnowski et al. |
| 2010/0171122 | A1 | 7/2010 | Eguchi |
| 2011/0240996 | A1 | 10/2011 | Lin et al. |
| 2011/0309462 | A1* | 12/2011 | Sargent ............... H01L 27/1461 257/443 |
| 2012/0081579 | A1 | 4/2012 | Doepke et al. |
| 2013/0100326 | A1 | 4/2013 | Veno et al. |
| 2013/0168643 | A1 | 7/2013 | Lin et al. |
| 2013/0250150 | A1 | 9/2013 | Malone et al. |
| 2014/0077283 | A1 | 3/2014 | Lenchenkov |
| 2014/0175591 | A1 | 6/2014 | Tian et al. |
| 2015/0070488 | A1 | 3/2015 | Wang et al. |
| 2015/0189199 | A1 | 7/2015 | Borremans et al. |
| 2015/0208011 | A1 | 7/2015 | Sargent et al. |
| 2015/0325721 | A1 | 11/2015 | Toda |
| 2016/0035920 | A1 | 2/2016 | Tashiro et al. |
| 2016/0037070 | A1 | 2/2016 | Mandelli et al. |
| 2016/0037093 | A1 | 2/2016 | Mandelli et al. |
| 2016/0037099 | A1 | 2/2016 | Mandelli et al. |
| 2016/0037114 | A1 | 2/2016 | Mandelli et al. |
| 2017/0263686 | A1 | 9/2017 | Beiley et al. |
| 2017/0264836 | A1 | 9/2017 | Mandelli et al. |
| 2018/0020171 | A1* | 1/2018 | Miyake .................. H04N 5/353 |

OTHER PUBLICATIONS

"International Application Serial No. PCT/US2017/013602, Written Opinion dated Apr. 7, 2017", 5 pgs.
U.S. Appl. No. 15/456,312 office action dated Nov. 15, 2017.
International Application # PCT/US2017/036548 search report dated Aug. 31, 2017.
Mandelli et al., U.S. Appl. No. 15/617,284, filed Jun. 8, 2017.
U.S. Appl. No. 15/456,303 office action dated Feb. 15, 2018.
U.S. Appl. No. 15/456,312 Office Action dated Jun. 14, 2018.
U.S. Appl. No. 14/813,597 Office Action dated Jun. 14, 2018.
U.S. Appl. No. 15/456,303 Office Action dated May 10, 2018.

* cited by examiner

HIGH-PERFORMANCE IMAGE SENSORS INCLUDING THOSE PROVIDING GLOBAL ELECTRONIC SHUTTER

RELATED APPLICATIONS

This application claims the benefit of priority to U.S. Patent Application No. 62/279,611 and entitled, "High-performance image sensors including those providing global electronic shutter," filed Jan. 15, 2016, which is hereby incorporated by reference in its entirety.

TECHNICAL FIELD

The present invention generally relates to optical and electronic devices, systems, and methods that include optically sensitive material, such as nanocrystals or other optically sensitive material, and methods of making and using the devices and systems.

BACKGROUND

Optoelectronic devices, such as image sensors and photovoltaic devices, can include optically sensitive material. Example image sensors include devices that use silicon both for the sensing function and for the read-out electronics and multiplexing functions. In some image sensors, optically sensitive silicon photodiodes and electronics can be formed on a single silicon wafer. Other example image sensors can employ a distinct material, such as InGaAs (for short-wave IR sensing), or amorphous selenium (for x-ray sensing), for the sensing (photon-to-electron conversion) function. Example photovoltaic devices include solar cells that use crystalline silicon wafers for photon-to-electron conversion. Other example photovoltaic devices can use a separate layer of material such as amorphous silicon or polycrystalline silicon or a distinct material for photon-to-electron conversion. However, these image sensors and photovoltaic devices have been known to have a number of limitations.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

DETAILED DESCRIPTION

Figure 1:
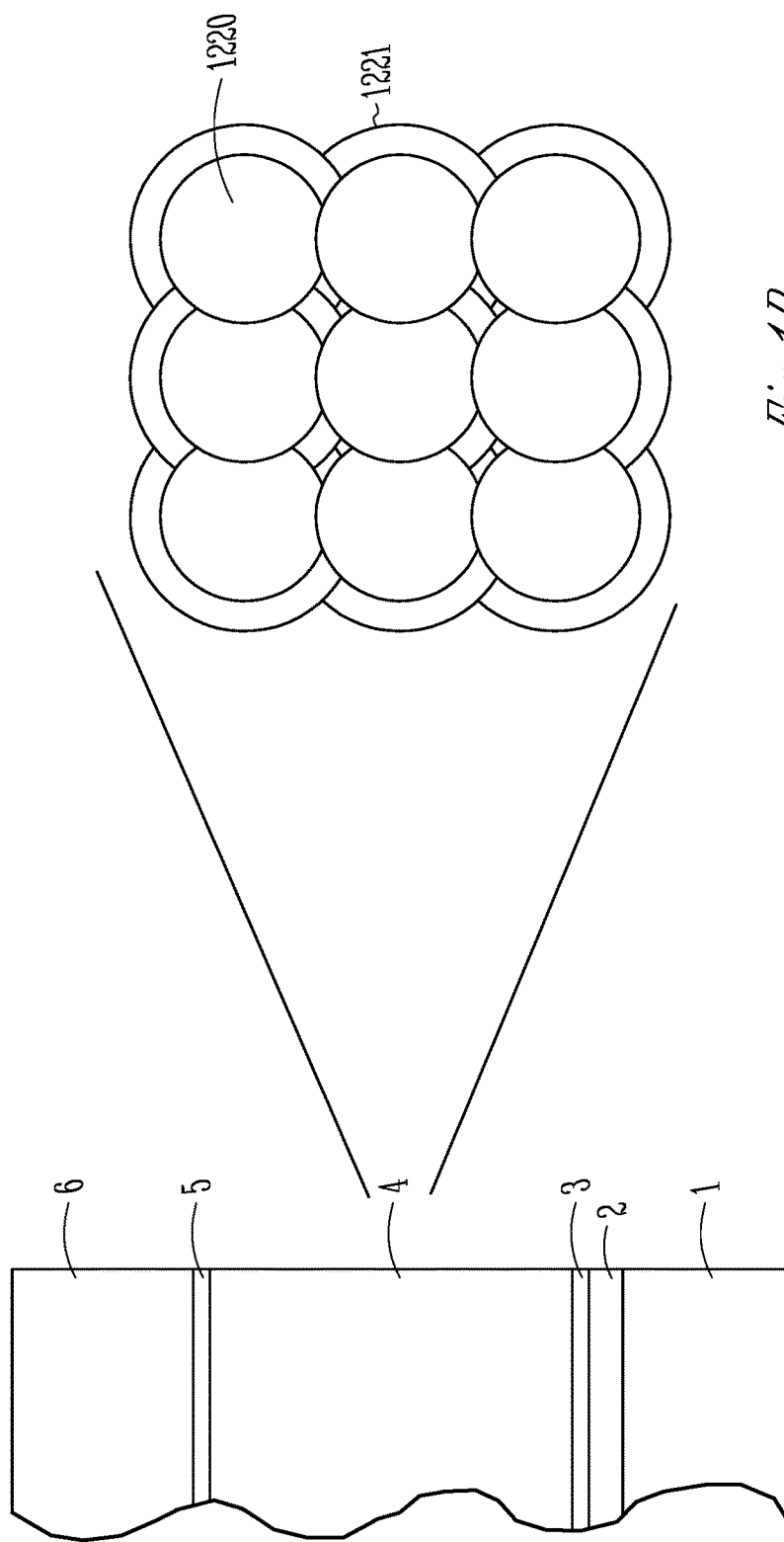
FIGS. 1A and 1B shows a materials stack, including quantum dots within the stack, under an embodiment.

Various embodiments of an optically sensitive device are described below. The device comprises a first contact and a second contact, each having a work function, and an optically sensitive material between the first contact and the second contact. The optically sensitive material comprises a p-type semiconductor, and the optically sensitive material has a work function. The device comprises circuitry that applies a bias voltage between the first contact and the second contact. The magnitude of the work function of the optically sensitive material is at least about 0.4 eV greater than the magnitude of the work function of the first contact, and also at least about 0.4 eV greater than the magnitude of the work function of the second contact. The optically sensitive material has an electron lifetime that is greater than the electron transit time from the first contact to the second contact when the bias is applied between the first contact and the second contact. The first contact provides injection of electrons and blocking the extraction of holes. The interface between the first contact and the optically sensitive material provides a surface recombination velocity less than about 1 cm/s.

An optically sensitive device is described below. The device comprises a first contact, an n-type semiconductor, an optically sensitive material comprising a p-type semiconductor, and a second contact. The optically sensitive material and the second contact each have a work function shallower than about 4.5 eV. The device comprises circuitry that applies a bias voltage between the first contact and the second contact. The optically sensitive material has an electron lifetime that is greater than the electron transit time from the first contact to the second contact when the bias is applied between the first contact and the second contact. The first contact provides injection of electrons and blocks the extraction of holes. The interface between the first contact and the optically sensitive material provides a surface recombination velocity less than about 1 cm/s.

A photodetector is described below. The photodetector comprises a first contact and a second contact, each having a work function. The photodetector comprises an optically sensitive material between the first contact and the second contact, the optically sensitive material comprising a p-type semiconductor, and the optically sensitive material having a work function. The photodetector comprises circuitry that applies a bias voltage between the first contact and the second contact. The magnitude of the work function of the optically sensitive material is at least about 0.4 eV greater than the magnitude of the work function of the first contact, and also at least about 0.4 eV greater than the magnitude of the work function of the second contact. The photodetector comprises circuitry that applies a bias voltage between the first contact and the second contact. The optically sensitive material provides a responsivity of at least about 0.8 A/W when the bias is applied between the first contact and the second contact.

In the following description, numerous specific details are introduced to provide a thorough understanding of, and enabling description for, embodiments of the systems and methods. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

Image sensors incorporate arrays of photodetectors. These photodetectors sense light, converting it from an optical to an electronic signal. Following is a description of numerous features, any one or a combination of which can be found in the photodetectors of an embodiment; the embodiments herein are not, however, limited to only these features.

The photodetectors of an embodiment are readily integrable with other circuitry related to the image sensing function, such as circuits which store charge, circuits which relay signal levels to the periphery of the array, circuits which manipulate these signal levels in the analog domain, circuits which convert analog into digital signals, and circuits which process image-related data in the digital domain.

The photodetectors of an embodiment provide a maximum of sensitivity to light within the wavelength band, or bands, of interest, along with low dark current. Sensitivity is often quantified using the measure signal-to-noise ratio (SNR) at a given level of illumination. Signal is maximized when the responsivity, quantum efficiency, or gain of the device is maximized. Noise is minimized when random fluctuations in electronic signals are minimized, subject to the limits prescribed by natural fluctuations in electrical currents and voltages at a given temperature. Relatedly, noise and other uncontrolled or difficult-to-predict variations in background signal are generally reduced or minimized when the magnitude of dark current is reduced or minimized.

The photodetectors of an embodiment provide a response time that is relatively fast when compared to conventional photodetectors formed using conventional processing methods. Applications such as video imaging and shutterless still-image acquisition typically require photodetectors whose signal levels change substantially completely in response to a transient within fewer than 100 milliseconds (10 frames per second), or fewer than 33 milliseconds (30 frames per second), or even 1 millisecond (1/1000 second exposure of a still image).

The photodetectors of an embodiment provide for the detection of a wide range of light intensities in a manner that can conveniently be processed by conventional electronic circuitry. This feature is known as providing high dynamic range (HDR). One method of providing high dynamic range is to compress the measured electronic response as a function of the incident optical stimulus. Such compression can be referred to as a sublinear, for example, a nonlinear with decreasing slope, dependence of electrical signal on incident intensity. High dynamic range can also be facilitated by employing a photodetector whose gain can be controlled, such as through the selection of a voltage bias known to produce a specific gain.

The photodetectors of an embodiment can provide for the discrimination among different spectral bands of electromagnetic radiation. Of particular interest are the x-ray, ultraviolet, visible (including blue, green, and red), near-infrared, and short-wavelength infrared bands.

A description follows of methods and processes for creating, integrating (e.g., with circuits), and exploiting in a variety of applications top-surface photodetectors or arrays of photodetectors.

The photodetectors, and arrays of photodetectors, described herein can readily be integrated with other portions of image sensor circuits and systems by methods such as spin-coating, spray-coating, drop-coating, sputtering, physical vapor deposition, chemical vapor deposition, and self-assembly, to name a few. Embodiments include exchanging ligands passivating nanoparticle surfaces for shorter ligands that will provide for appropriate charge carrier mobilities once films are formed. Embodiments include solution-phase exchanges which enable the realization of smooth-morphology films necessary to the realization of image sensors having acceptable consistent dark currents and photoresponses across an array.

The photodetectors described herein provide relatively maximum sensitivity. They maximize or increase a signal by providing photoconductive gain. Values for photoconductive gain range from 1 to 50, resulting in responsivities in, for example, the visible wavelengths ranging from about 0.4 A/W to about 20 A/W. In embodiments, the photodetectors described herein minimize noise by fusing nanocrystal cores such as to ensure substantially non-noise-degrading electrical communication among the particles making up the optically sensitive layer through which current flows. In embodiments, the photodetectors described herein reduce or minimize dark current by minimizing the net doping of the active layer, thus ensuring that the dark carrier density, and thus the dark conductance, of these optically sensitive materials is minimized or reduced. In embodiments, the photodetectors described herein minimize or reduce dark current by providing an electrode-to-nanocrystalline-layer electrical connection that blocks, for example, one type of carrier, including potentially the majority carrier, at equilibrium. In embodiments, cross-linking molecules are employed that utilize chemical functionalities that remove oxides, sulfates, and/or hydroxides responsible for p-type doping. Thus, in embodiments, a more intrinsic or even n-type optically sensitive layer can be provided, leading to lowered dark currents. In embodiments, many steps in quantum dot synthesis and/or processing and/or device packaging can be performed in a controlled environment such as a Schlenk line or Glove Box; and optically sensitive layers can be encapsulated using substantially impermeable layers such as oxides, oxynitrides, or polymers such as polyxylylene, or epoxies, in order to prevent reactive gases such as oxygen or water from significantly permeating the optically sensitive layer. In this manner, combinations of properties such as gain, dark current, and lag can be preserved over the useful lifetime of an image sensor.

The photodetectors described herein provide a time-domain response that can be as rapid as approximately sub-100-milliseconds, sub-30-milliseconds, and sub-1-millisecond. In embodiments, this is achieved by providing gain-providing (and persistence-providing) trap states associated with the optically sensitive layer that trap at least one type of carrier for only a limited time period such as 100 milliseconds, 30 milliseconds, or sub-1 millisecond. In embodiments, PbS nanoparticles are decorated with $PbSO_3$, an oxide of PbS, which is shown to have a trap state lifetime in the vicinity of approximately about 20 milliseconds to about 30 milliseconds, providing for a transient response suited to many video imaging applications. In embodiments, photodiodes are instead provided based on colloidal quantum dot layers, wherein two electrical contacts having appreciably different work functions are employed to contact the active layer. In embodiments, dark currents can be minimized or reduced through operation of such devices without the application of an appreciable external voltage bias. In embodiments, cross-linking moieties such as benzenedithiol, a bidentate linker, can be employed to remove and/or passivate certain trap states that can be present, or can develop, in such materials.

The photodetectors described herein provide enhanced dynamic range by producing a sublinear dependence of electrical signal (such as photocurrent). Over a region of low to middling intensities, trap states are available to become filled, and escape occurs following some moderate persistence, or trap state, lifetime, such as about 30 milliseconds, for example. At higher intensities, these trap states become substantially filled, such that charge carriers experience shorter lifetimes, or persistence times, corresponding to lower differential gains. As a result, these devices exhibit substantially constant gains over a range of low to middling intensities, followed by a gentle roll-off in gain at higher intensities. Put another way, at low to middling intensities, photocurrent depends approximately linearly on intensity, but at higher intensities, photo current exhibits sub-linear dependence on intensity. In embodiments, photodetectors are provided wherein photoconductive gain depends on the bias applied to a device. This arises because gain is proportional to carrier lifetime divided by carrier transit time, and transit time varies in inverse proportionality with applied field. In embodiments, circuits are developed that exploit this dependence of gain on bias to increase dynamic range.

In embodiments, photodetectors described herein are readily altered, or 'tuned,' to provide sensitivity to different spectral bands. Tuning is provided herein through the quantum size effect, whereby nanoparticle diameter is decreased, in cases through synthetic control, to increase the effective bandgap of the resulting quantum dots. Another method of tuning is provided through the choice of materials composition, wherein the use of a material having a larger bulk bandgap generally facilitates the realization of a photodetector with responsivity onset at a relatively higher photon energy. In embodiments, photodetectors having different absorption onsets can be superimposed to form vertical pixels, wherein pixel(s) closer to the source of optical signal absorb and sense higher-energy bands of electromagnetic radiation, whereas pixel(s) further from the source of optical signal absorb and sense lower-energy bands.

FIGS. 1A and 1B shows a materials stack, including quantum dots within the stack, under an embodiment. The materials stack is integrated with complementary metal-oxide-semiconductor (CMOS) silicon circuitry, but is not so limited. The use of CMOS silicon circuitry to read the signals transduced by photoconductive photodetectors, including top-surface photodetectors, and including those based on colloidal quantum dots including PbS, includes the integration of top-surface photoconductive materials with silicon CMOS electronics. The structure and composition of the photoconductive photodetector is described in more detail below.

Figure 2:
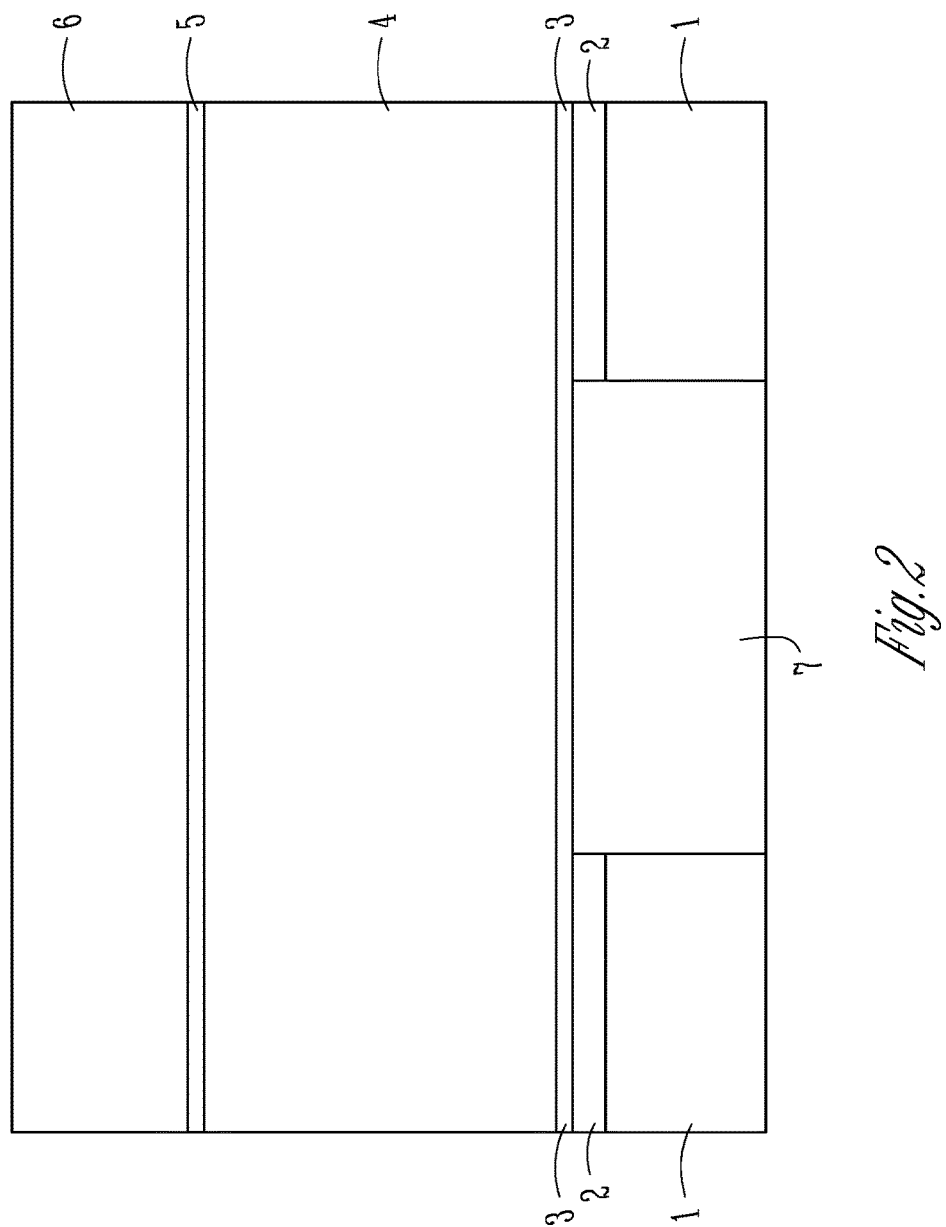
FIG. 2 shows a cross-section of the materials stack over a portion of a pixel, under an embodiment.

FIG. 2 shows a cross-section of the materials stack over a portion of a pixel, under an embodiment. FIG. 2 depicts, in the left and right hand sides or regions, the same materials stack referenced in FIG. 1A. In the lateral middle of the device is incorporated a discontinuity in the material metal '1' which is replaced by material '7.' Material '7' can in general be, for example, an insulator such as $SiO_2$ or $SiO_xN_y$. Embodiments of FIG. 2 can be referred as a portion of a lateral pixel. In embodiments, current substantially flows between metals '1' through material '2' (interface), material '3' (adhesion), and material '4' (photosensitive layer). Different portions or regions of the materials stack described herein are referred to herein as "materials" or "layers" but are not so limited.

Figure 3:
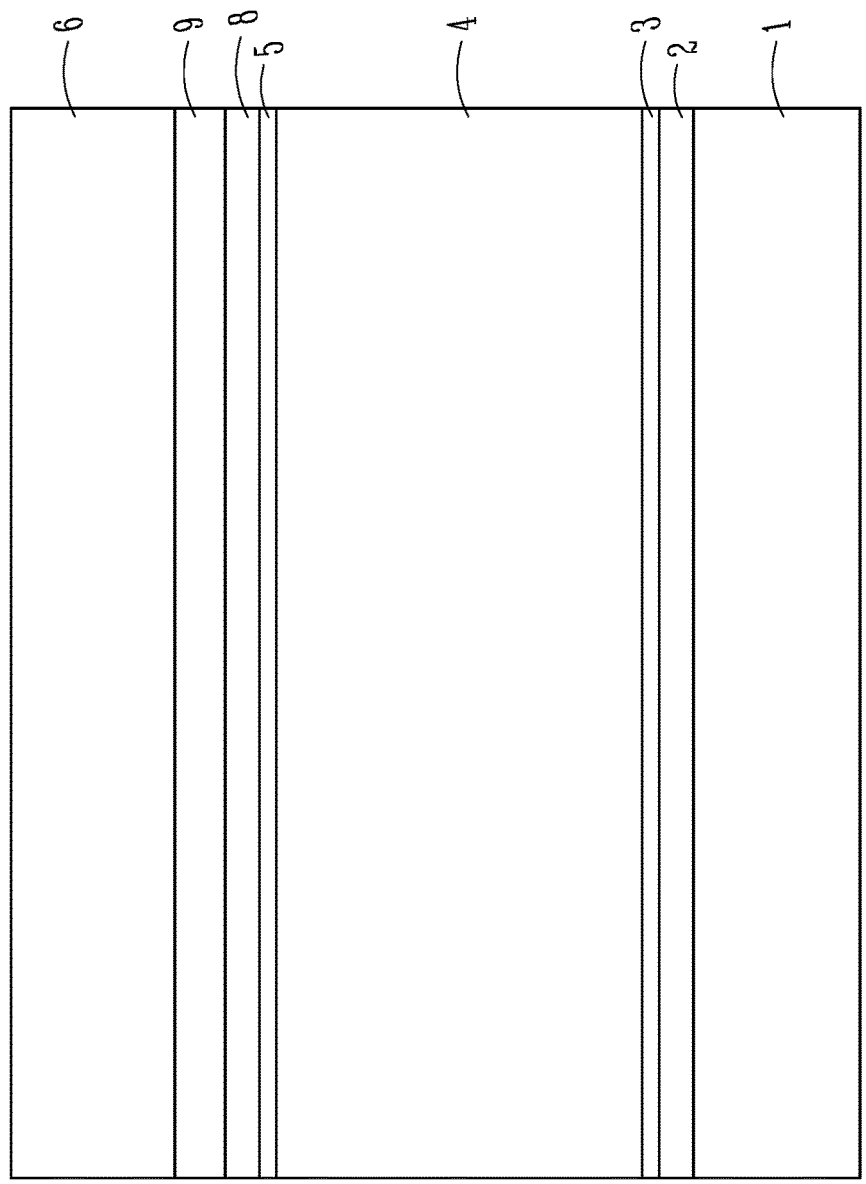
FIG. 3 shows a cross-section of the materials stack over a pixel, under an embodiment.

FIG. 3 shows a cross-section of the materials stack over a pixel, under an embodiment. Embodiments of FIG. 3 can be referred to as a portion of a vertical pixel. FIG. 3 shows materials '1,' '2,' '3,' '4,' '5,' and '6' generally the same materials stack as described above with reference to FIG. 1A. An interface material or layer '8' is incorporated or integrated on a top portion or region of the device. Material '8' comprises a member or members of the sets of materials described herein as material '2.' A metal or contact layer or material '9' is incorporated or integrated on a top portion or region of the device. The metal or contact layer '9' comprises a member or members of the sets of materials described herein as material '1.' In embodiments, material '9' comprises a transparent conductive material such as indium tin oxide, tin oxide, or a thin (substantially nonabsorbing to visible light) metal such as TiN, Al, TaN, or other metals recited below under material '1.'

Material '1' is a metal that lies above the substrate (not shown) and can be a silicon CMOS integrated circuit. During processing it can be, for example, a 200 mm or a 300 mm wafer; in general, a wafer or other substrate that has not yet been singulated to form die. Material '1' refers to a metal, present at the top surface of the CMOS integrated circuit wafer, which is presented and available for physical, chemical, and electrical connection with subsequent layers. The metal can include, for example, TiN, TiO2, $Ti_xN_y$, Al, Au, Pt, Ni, Pd, ITO, Cu, Ru, TiSi, $WSi_2$, and combinations thereof. Material '1' is referred to as the contact, or the electrode, although it shall be discussed herein that the behavior of this contact may be influenced by thin layers that can reside between the metal and material '4,' the photoconductive quantum dot layer.

The metal can be chosen to achieve a particular work function, and can influence whether an ohmic or non-ohmic (e.g., Schottky) contact is formed with respect to the layers to which it is proximate. For example, the metal can be chosen to provide a shallow work function, such as a value generally between about −2.0 eV and about −4.5 eV, for example, values lying between about −2.0 eV and about −4.2 eV.

The metal can achieve a surface roughness less than 5 nm root-mean-squared.

The metal can be patterned with a critical dimension of 0.18 micrometers or smaller. The metal can be patterned such that, pixel-to-pixel, the spacing of the electrodes (such as between a pixel center electrode and a grid) does not vary by more than a standard deviation of about 1%.

The metal can be terminated with an oxide such as a native oxide, such as $TiO_xN_y$ in the case of TiN. In general, this oxide, or other materials atop it such as organic residues, inorganic residues such as 'polymer,' etc., are of a consistent and known composition thickness.

The metal can be a conductive material, where the bulk of the material constituting the metal can have a resistivity that is less than 100 microOhm*cm.

The metal can be processed such that, across the wafer, in all regions where light-sensing pixels are to be formed, it is not capped with any additional oxides or organics or contaminants.

The top surface of the wafer, prior to or after the formation of the interface layer, can comprise regions of metal and insulating material (such as an insulating oxide), such that the peak-to-valley distance of features on this surface is less than 50 nm.

Prior to the introduction of the photosensitive semiconductor layer, the leakage current flowing between a pixel electrode in the center of a 1.1 µm×1.1 µm or 1.4 µm×1.4 µm square grid electrode should be less than about 0.1 fA at 3 V bias.

Layers or materials above material '1' form an interface, or interface layer. Each of the layers forming the interface is described in more detail below, in turn.

Material '2' is the first part or portion of the interface layer, and comprises a material that resides atop the metal. Material '2' can comprise a pure, clean surface of the metal. The material of this layer can include oxides, including those generally formed, either through exposure to water, oxygen, or other oxidizing species, as a result of the presence of the exposed metal; or it can be deliberately formed such as through exposure to a controlled oxidizing environment and exposures to elevated temperatures, such as in rapid thermal processing. Native oxides include, for example, the following: $TiO_2$ and $TiO_xN_y$ atop TiN; $Al_2O_3$ atop Al; $Au_2O_3$ atop Au; PtO or $PtO_2$ on Pt; $Ni_2O_3$ atop Ni; $WO_3$ atop W; PdO atop Pd; and oxygen-rich ITO atop ITO. It can be that such a native oxide is to be removed, such as using etching, and replaced with another layer. For example, a native oxide such as $TiO_xN_y$ can be etched (using a process such as argon sputtering) and then a layer can be deposited on top of it such as a controlled oxide such as $TiO_2$, $TiO_x$, or $TiO_xN_y$. The sum of the thicknesses of native oxides and deliberately-deposited oxides can be between about 2 nm and about 20 nm.

A portion of material '2' can be a material that is substantially transparent to most or all wavelengths of visible light. It can have a bandgap that is larger than about 2 eV or larger than about 2.5 eV or larger than about 3 eV. It can be a large-bandgap doped semiconductor. It can achieve doping through stoichiometry, such as in the case of $TiO_x$ where x is varied below or above material '2' in order to achieve net doping. Values of x can be typically about 1.9 to achieve an excess of Ti over stoichiometric $TiO_2$. Values of x can typically be about 2.1 to achieve an excess of O over stoichiometric $TiO_x$. $TiO_x$ where x less than approximately 2 can be achieved by exposing stoichiometric $TiO_2$ to a reducing environment. The density of free electrons can be increased, corresponding to greater n-type doping, by increasing the extent to which initially stoichiometric $TiO_2$ is reduced, for example, by decreasing x in $TiO_x$ more considerably relative to the value 2. $TiO_2$ can be doped with nitrogen in order to modify its free carrier concentration, work function, and electron affinity. $TiO_2$ or $TiO_x$ can be doped with, for example, B, C, Co, Fe. It can be a mildly n-type material such as lightly doped $TiO_x$ having an equilibrium carrier density of $10^{10}$ $cm^{-3}$. It can be a moderately doped n-type material such as $TiO_x$ having an equilibrium carrier density of $10^{16}$ $cm^{-3}$. It can be a more strongly doped n-type material such as $TiO_x$ having an equilibrium carrier density of $10^{18}$ or $10^{19}$ $cm^{-3}$. Its electron affinity can correspond energetically substantially closely with the work function of the metal. Its work function can correspond substantially closely with the work function of the metal. Its ionization potential can reside at an energy that is much deeper than the ionization potential of the optically-absorbing layer (material '4' described herein). It can be terminated through annealing processes, gas-phase treatments, or chemical treatments such as exposure to organic molecules, such as to achieve a low surface recombination velocity for holes when in contact with an adjacent semiconductor layer such as the optically-absorbing layer (layer '4' discussed below).

Material '3' can also be present in the interface layer, and comprises a material that can be positioned or reside atop the first portion of the interface layer. Material '3' includes adsorbed organics such as organic molecules, introduced deliberately or accidentally or through some combination thereof, that reside above the metal, either in direct contact with the metal, or in direct contact with the metal oxide. These molecules are discussed in detail herein.

Embodiments include material '2' while material '3' is absent. Such embodiments include choices of materials in which no adhesion layer such as that provided by material '3' is required. As an example, if material '2' incorporates a metal such as titanium, such as if material '2' incorporates $TiO_x$, and if material '4' incorporates a crosslinker such as mercaptobenzoic acid, in which one functional group on the mercaptobenzoic acid binds the $TiO_x$, then adhesion between material '4' and material '2' can be provided without explicit inclusion of material '3.'

In embodiments, all of material '1,' material '2,' and material '3' can be present. Embodiments included cases where a Schottky contact is made via the metal '1' to the material '4' without the deliberate introduction of a heterojunction. Embodiments included a device in which TiN or $TiO_xN_y$ forms the metal '1,' layer '2' is a clean termination of the metal '1,' with no significant formation of a native oxide, an adhesion layer such as hexamethyldisilazane is provided in material '3.'

In embodiments, all of material '1,' material '2,' and material '3' can be present. Embodiments include cases where a heterojunction is formed via the use of a large-bandgap oxide in material '2' to the photosensitive layer '4.' Embodiments include a device in which TiN or $TiO_xN_y$ forms the metal '1,' layer '2' includes a large-bandgap semiconductor such as $TiO_x$ (which can be structurally doped, impurity doped, both, or neither), and an adhesion layer such as hexamethyldisilazane can be provided in material '3.'

In embodiments, material '1' can be aluminum metal, material '2' can include a native oxide of aluminum and can include a doped conductive oxide such as doped $Al_2O_3$ and/or can include a large-bandgap semiconductor such as $TiO_x$ (which can be structurally doped, impurity doped, both, or neither), and material '3' can include an adhesion layer such as hexamethyldisilazane can be provided in material '3.'

In embodiments, material '1' can include aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, metals used in standard CMOS such as aluminum, tungsten, tantalum, titanium, copper can be utilized.

In embodiments, material '2' can include a surface of the metal and can include oxides, nitrides, or oxynitrides of aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can include oxides, nitrides, or oxynitrides of metals used in standard CMOS such as aluminum, tungsten, tantalum, titanium, copper.

In embodiments, material '2' can comprise multiple sublayers. In embodiments, it can comprise a sublayer consisting of a metal such as aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, this sublayer can comprise metals used in standard CMOS such as aluminum, tungsten, tantalum, titanium, copper. In embodiments, material '2' can comprise a further sublayer consisting of oxides, nitrides, or oxynitrides of aluminum, gallium, indium, tin, lead, bismuth, magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can be preferred that this further sublayer include oxides, nitrides, or oxynitrides of metals used in standard CMOS such as aluminum, tungsten, tantalum, titanium, copper.

The layer referred to as material '4' refers to an optically-absorbing layer that includes nanocrystals, or quantum dots. A quantum dot (QD), depicted in '1220' in FIG. 1B, can be a nanostructure, for example a semiconductor nanostructure, that confines conduction band electrons, valence band holes, or excitons (bound pairs of conduction band electrons and valence band holes) in all three spatial directions. The confinement can be due to electrostatic potentials (e.g., generated by external electrodes, doping, strain, impurities), the presence of an interface between different semiconductor materials (e.g., in core-shell nanocrystal systems, incorporated in '1221' of FIG. 1B) or a semiconductor and another material (e.g., a semiconductor decorated by organic ligands; or by a dielectric such as an oxide such as PbO, a sulfite such as $PbSO_3$, a sulfate such as $PbSO_4$, or $SiO_2$ incorporated in '1221' of FIG. 1B), the presence of a semiconductor surface incorporated in '1221' of FIG. 1B, or a combination of one or more of these. A quantum dot exhibits in its absorption spectrum the effects of the discrete quantized energy spectrum of an idealized zero-dimensional system. The wave functions that correspond to this discrete energy spectrum are substantially spatially localized within the quantum dot, but extend over many periods of the crystal lattice of the material. In one example embodiment, the QD can have a core of a semiconductor or compound semiconductor material, such as PbS. Ligands can be attached to some or all of the outer surface or can be removed in some embodiments. In some embodiments, the cores of adjacent QDs can be fused together to form a continuous film of nanocrystal material with nanoscale features. In other embodiments, cores can be connected to one another by linker molecules. In some embodiments, trap states can be formed on the outer surface of the nanocrystal material. In some example embodiments, the core can be PbS and trap states can be formed by an oxide such as $PbSO_3$ formed on the outer surface of core.

A QD layer can include a continuous network of fused QD cores, having outer surfaces that are of a different composition than that in the core, e.g., oxidized core material such as $PbSO_3$, or a different kind of semiconductor. The individual QD cores in the film are in intimate contact, but continue to exhibit many of the properties of individual quantum dots. For example, a lone (unfused) quantum dot has a well-characterized excitonic absorbance wavelength peak that arises from quantum effects related to its size, for example, 1 nm to 10 nm. The excitonic absorbance wavelength peak of the fused QDs in the film is not significantly shifted from the central absorbance wavelength that was present prior to fusing. For example, the central absorbance wavelength can change by about 10% or less when fused. Thus, the QDs in the film retain their quantum effects, despite the fact that they can be an integral part of a macroscopic structure. In some embodiments, QD cores are linked by linker molecules as described further below. This allows current to flow more readily than through unlinked, unfused QDs. However, the use of linker molecules to form a continuous film of QDs instead of fusing the cores can reduce the dark current for some photo conductor and image sensor embodiments.

In some embodiments, the QD layer is exceptionally radiation sensitive. This sensitivity is particularly useful for low-radiation imaging applications. At the same time, the gain of the device can be dynamically adjusted so that the QDPC saturates, that is, additional photons continue to provide additional useful information that can be discerned by the readout electronic circuit. Tuning of gain can be conveniently achieved by changing the voltage bias, and thus the resultant electric field, across a given device, for example, a pixel. Some embodiments of QD devices include a QD layer and a custom-designed or pre-fabricated electronic read-out integrated circuit. The QD layer is then formed directly onto the custom-designed or pre-fabricated electronic read-out integrated circuit. The QD layer can additionally be patterned so that it forms individual islands. In some embodiments, wherever the QD layer overlies the circuit, it continuously overlaps and contacts at least some of the features of the circuit. In some embodiments, if the QD layer overlies three-dimensional features of the circuit, the QD layer can conform to these features. In other words, there exists a substantially contiguous interface between the QD layer and the underlying electronic read-out integrated circuit. One or more electrodes in the circuit contact the QD layer and are capable of relaying information about the QD layer, for example, an electronic signal related to the amount of radiation on the QD layer, to a readout circuit. The QD layer can be provided in a continuous manner to cover the entire underlying circuit, such as a readout circuit, or patterned. If the QD layer is provided in a continuous manner, the fill factor can approach about 100%, with patterning, the fill factor is reduced, but can still be much greater than a typical 35% for some example CMOS sensors that use silicon photodiodes. In many embodiments, the QD optical devices are readily fabricated using techniques available in a facility normally used to make conventional CMOS devices. For example, a layer of QDs can be solution-coated onto a pre-fabricated electronic read-out circuit using, for example, spin-coating, which is a standard CMOS process, and optionally further processed with other CMOS compatible techniques to provide the final QD layer for use in the device. Because the QD layer need not require exotic or difficult techniques to fabricate, but can instead be made using standard CMOS processes, the QD optical devices can be made in high volumes, and with no significant increase in capital cost (other than materials) over current CMOS process steps.

The QD material can have an absorption cutoff approximately at the edge of the visible wavelength range, such as round 650 nm. The QD material can have an absorption cutoff at longer wavelengths, in order to ensure a high absorbance over the entire visible, such as when the absorption cutoff is in the 700 nm to 900 nm range.

The QD film can be deposited using conventional spin-on process, ink-jet printing process, Langmuir-Blodgett film deposition, electrokinetic sprays, or nano-imprint. The QD film can be deposited using dispensing of QD solution on a wafer at about 30 RPM followed by a three-step spin process.

The spectral position of the peak in the QD solution absorption can be specified to lie at about 740 nm, +/−10 nm. The ratio of the absorbance at the QD absorption peak near 740 nm, and the valley slightly to the blue of this peak, can be specified to be about 1.2.

The thickness of the quantum dot layer can be specified to be 300 nm+/−50 nm. The thickness of the quantum dot layer can be chosen to ensure that, over the spectral range of about 400 nm to about 640 nm, greater than 90% of all light incident on the film is absorbed. The roughness (root-mean-squared) of the quantum dot film can be specified to be less than about 5 nm.

The dark current in a 1.1 μm×1.1 μm pixel can be less than about 0.5 fA under suitable bias, such as a 3 V bias. The gain can be greater than about 10 in a 1.1 μm×1.1 μm pixel.

Alkali metal impurities can be present at lower than 5E17 $cm^{-3}$ concentration in the quantum dot film. Defects greater than about 0.16 microns in size can be fewer than about 20 across a 200 mm wafer. The mobility of the flowing carrier can exceed 1E-5 $cm^2/Vs$. The loading fraction of nanocrystals in the film can exceed about 30% by volume.

Incorporated into material '4' can be chemical species such as PbO, $PbSO_4$, $PbSO_3$, poly-sulfates; and they can also include physically-adsorbed species such as $O_2$, $N_2$, Ar, $H_2$, $CO_2$, $H_2O$, and $H_2S$.

Incorporated into material '4' can be molecules that are bound to the surface of at least one nanoparticle, or nanocrystal, or quantum dot. These can include thiol-terminated ligands such as benzenethiol, ethanethiol; carboxylate-terminated molecules such as oleic acid and formic acid; amine-terminated ligands such as pyridine, butylamine, octylamine. They can also include bidentate cross linkers such as benzenedithiol, ethanedithiol, and butanedithiol. They can also include multidentate molecules that include (1) a backbone; (2) certain sidegroups and/or endgroups that bind to the nanoparticle surface, including thiols, amines, carboxylates; and (3) other functional groups such as those that confer solubility in polar, nonpolar, and partially polar solvents.

Material '5' can include layers on top of '4' that can provide passivation of the underlying material, including minimizing the extent of movement of species between layers '1' to '4' of the materials stack and the outside of the materials stack. This layer can also facilitate good physical adhesion with overlying layers such as encapsulant layers.

Material '6' refers to a layer, or layers, that can be included on top of the material stack and can serve to minimize the extent of movement of species between layers '1' to '4' of the materials stack and the outside of the materials stack. In a planar cell configuration, the quantum dot film layer can be encapsulated against oxygen and moisture diffusion using a low-temperature (less than about 100° C.) PECVD $SiO_2$, SiN, or SiOCN process providing optically transparent film suitable for further integration with CFA. The film can be specified to have a thickness of about 200 nm+/−10 nm. It can be specified to have a surface roughness less than about 5 nm rms. Optical transmittance can exceed about 99%. Adhesion can be provided to the underlying layers. An embodiment can have fewer than about twenty greater-than-0.1 μm particle defects across a 200 mm wafer. An embodiment can have fewer than about twenty greater-than-0.1 μm pinholes across a 200 mm wafer.

The nature of the interface between the electrical contact and the light-sensitive semiconductor is an important determinant of device stability and performance. For example, whether the contact is ohmic versus Schottky, and whether the contact and semiconductor are separated by a thin interfacial layer, which passivates at least one of the {semiconductor and the contact}, are important in stability and performance.

The composition of the photoconductive layer—for example the presence of surface trap states on the semiconductor materials making up the photoconductor—is an important determinant of device performance and stability. In particular, photoconductive materials are often sensitive to the presence of physisorbed or chemisorbed species, possibly originally presented as a gas (such as $O_2$, $H_2O$, $CO_2$), on the nanoparticle surfaces—these must thus be carefully controlled during processing, and an encapsulating and/or passivating layer(s) can be used, above and/or below, the photoconductive layer, to preserve consistent photoconductive features over time. Further description follows of the interface between metal and semiconductor of an embodiment as well as encapsulation of an embodiment.

The layer '4' can be made from silicon, including single-crystal silicon, polycrystalline silicon, nanocrystalline silicon, or amorphous silicon including hydrogenated amorphous silicon.

The layer '4' can include materials that are not substantially quantum-confined, but instead substantially retain the bandgap of a bulk semiconductor. Embodiments include crystalline or polycrystalline or nanocrystalline or amorphous embodiments of materials such as silicon, gallium arsenide, carbon, PbS, PbSe, PbTe, $Bi_2S_3$, $In_2S_3$, Copper-Indium-Gallium-Selenide (or Sulfide), SnS, SnSe, SnTe, in which the characteristic size of any crystalline or partially-crystalline subunits is typically not smaller than the Bohr exciton radius (the characteristic spatial extent of electron-hold pairs) in the semiconductor material employed.

The interface formation of an embodiment can comprise the cleaning and termination of material '1.'

The interface of an embodiment can comprise an oxide formed on material '1,' including a native oxide as a part of material '2.' The thickness of this oxide is an important determinant of device performance. Excessive oxide thicknesses (e.g., thicknesses exceeding about 10 nm to about 20 nm) can provide an excessive contact resistance in series with the photoconductive film, necessitating the application of an undesirably increased bias from the biasing circuit. In embodiments, the thickness of this native oxide is kept in the range of less than about 5 nm.

The interface of an embodiment can comprise a further thin layer as part of material '2,' such as $TiO_2$, generally included to modify the work function of the interface with the semiconductor to be placed on top. This layer can, in embodiments, provide selectivity in favor of one type of charge carrier: for example, $TiO_2$ can be configured such that, at the operating bias, it efficiently injects electrons into the conduction band of the photoconductive semiconducting layer; but, at this same bias, it withdraws holes from the valence band of the photoconductive semiconducting layer with much lower effectiveness. $TiO_2$ can be configured such that, at the operating bias, it efficiently extracts electrons from the conduction band of the photoconductive semiconducting layer; but, at this same bias, it injects holes into the valence band of the photoconductive semiconducting layer with much lower effectiveness.

The interface of an embodiment can comprise a further thin layer as part of material '2,' such as MEH-PPV, generally included to enable the flow of one type of charge carriers, such as holes, while blocking the flow of the other type, such as electrons.

The interface of an embodiment can comprise a thin layer as part of material '3,' possibly a self-organized molecular monolayer, designed to anchor on one side of the molecules to the underlying layers, and at the other terminus of the molecule to anchor to the semiconductor to be placed atop, with a goal of ensuring controlled electronic communication, and also ensuring mechanical stability, for example, good adhesion between the materials making up the multilayer device.

The layered structure of an embodiment provides efficient charge carrier transfer through an interface. In embodiments, the layered structure can form a substantially ohmic contact with the photoconductive semiconductor layer, providing for little or no depletion of the semiconductor near the interface, and providing for efficient injection and extraction of at least one type (e.g., electrons, holes) of charge carrier. In embodiments, the layered structure can form a Schottky contact with the photoconductive semiconductor layer, providing an energetic barrier that must be overcome for charge carriers to be injected and/or withdrawn. In embodiments, the layered structure can form a selective contact, providing considerably more efficient injection of one type of charge carrier (e.g., electrons) than it provides extraction of the other type (e.g., holes); and/or providing considerably more efficient withdrawal of one type of charge carrier (e.g., electrons) than it provides injection of the other type (e.g., holes).

The layered structure of an embodiment provides a work function of the contact surface where the effective workfunction is determined by the material of the electrode, material of the interfacial layer, and its thickness.

The layered structure of an embodiment provides blocking capability to suppress the undesirable carrier transfer, for example as a layer proving electron trap states on the surface of metal electrode in case of p-semiconductor photodetector device.

The layered structure of an embodiment provides strong bonding of the photosensitive semiconductor material to the metal electrode.

The layered structure of an embodiment provides high temperature stability of the metal electrode-semiconductor material interface.

The structure and composition of electronic devices of an embodiment with an engineered interfacial layer includes but is not limited to a metal electrode comprising a conventional material used in semiconductor manufacturing being either readily oxidized, or nitridized, or both in a chosen stoichiometric combination, such as Ti, W, Ta, Hf, Al, Cu, Cr, Ag; or being resistive to oxidation or nitridization such as Au, Pt, Rh, Ir, Ru, graphite, amorphous carbon, graphene, or carbon nanotubes. These metal electrodes can also be formed from alloys, conductive glasses, and various conductive intermetallics. The work function of the resultant electrodes can be tuned through exposure to, for example, oxygen, nitrogen, or a combination thereof at a specific temperature for a specific time.

The structure and composition of electronic devices of an embodiment includes an interfacial layer on the surface of the metal contact. The interfacial layer of an embodiment includes an oxide or intermetallic of the element of the electrode with the maximum thickness sufficient to keep the ohmic characteristics of the contact but with the minimum thickness sufficient to create electron trap states. The structure can be created or generated using physical vapor deposition (PVD), atomic layer deposition (ALD), chemical vapor deposition (CVD), ion cluster, ion beam deposition, ion implantation, anneal or other film deposition methods. Additionally, such films can be formed from aqueous and non-aqueous liquid formulations, which can include electrochemical techniques, to form hydroxides, oxides, fluorides, sulfides, sulfates, sulfites, sui phonates, phosphates, phosphonates, phosphides, nitrates, nitrites, nitrides, carbonates, carbides, and other types of salts or complexes of the metals. The average thickness of the interfacial layer can vary from about 0.1 nm to about 0.2 nm to about 10 nm to about 50 nm, depending on conductivity of the final interfacial layer, and work function of the metal electrode itself.

The interfacial layer of an embodiment includes another oxide deposited on the surface of the electrode, the oxide having been doped $TiO_2$, $HfO_2$, $Al_2O_3$, $SiO_2$, $Ta_2O_5$, $Zn_xAl_yO$, $Zn_xGa_yO$, $ZnIn_xSn_yO$, and similar p-conductive materials. Again, these materials can be deposited using the methods mentioned earlier.

Additional properties of the interfacial layer are determined by the necessity to form relatively strong chemical bond, preferably covalent, to the components of the semiconductor photosensitive layer. In case none of the components of the photosensitive layer provide chemical bonding to the interfacial layer, the surface of the interfacial layer is modified using organic by-functional molecules, where one type of functional group provides selective bonding to the interfacial layer surface, while the second type of functional groups provides bonding to either ligand or directly to semiconductor nanocrystals. These bonding molecules can be formed on non-conductive alkane or aryl backbone or can be formed on conductive backbone including aniline, acytelene, or other types of sp2 hybridized carbon. The functional groups to provide bonding to the oxidized surface of the electrode or surface of the interfacial layer include but are not limited to silanes, siloxanes, silizanes, primary, secondary, or tertiary amines, imides, phosphates, oximes, carboxylates. The average length of the organic molecule forming the interfacial layer can typically vary from about 2 carbon atoms to about 16 carbon atoms.

If the metal of the electrode is passive (e.g., Au, Pt, Cu, Ag, etc.) the interfacial layer can be formed from a molecule including two similar functional groups providing bonding directly to the metal surface on one side and to a nanocrystal on another side. An example would be formation of Au—S—R—S—NC bond. Again, thickness and conductivity of the organic interfacial layer can be defined by the required electronic device properties.

If the conductivity of the interfacial layer is exceeding the allowable limits required be the electronic device parameters (e.g., for a planar electrode element), the continuous film can be patterned using conventional patterning techniques.

In each electronic device with at least two electrodes, one of the electrodes can be made of a metal with one work function while another electrode can be made having a different workfunction and/or type of conductivity (electron or hole).

For a vertical configuration of electronic device, the same approach as above is used for the bottom electrode while the interfacial layer on top is formed by deposition of organic molecules or a thin transparent layer of the semiconductor material.

Molecules described above are polymers with the degree of polymerization from approximately 1 through approximately 10,000.

In forming a device described herein, generally, the device can be formed to include a consistent, reliable combination of material '1' and material '2' which can be followed by the controlled formation or material '3' and the optically-absorbing layer '4.' For example, an embodiment can provide through material '1' a highly conductive contact having resistivity less than 100 microOhm*cm and a work function lying between about −2 eV and about −4.5 V and lying between about −2 eV and about −4.2 eV. An embodiment can provide through material '2' a large-bandgap layer that permits the injection of electrons into the ensuing photosensitive semiconductor layer, but blocks the extraction of holes from this layer. An embodiment can achieve a controlled thickness of a doped substantially transparent oxide, such as n-type $TiO_x$, as part of the first part of material '2.' For example, an embodiment can achieve a $TiO_x$ thickness in the range of about 2 nm to about 20 nm, which is controlled to within about 1 nm to 5 nm; and where the $TiO_x$ has a specifically-chosen carrier density of $1 \times 10^{18}$ cm$^{-3}$ with a tight band of control such as about +/−10% in carrier density.

Manufacturing of a stack or configuration of layers of the device described herein can comprise, for example: (1) formation of the metal, such as via the sputtering of titanium in a nitrogen atmosphere, resulting in the formation of TiN; (2) subsequent processing that results in the formation of an interface layer such as a native oxide, such as $TiO_xN_y$ or $TiO_x$ (it can be that this subsequent processing results in range of possible oxide thicknesses and dopings and carrier concentrations); (3) removal of the native oxide layer through an etch such as a sulfuric acid—hydrogen peroxide—deionized water etch, or an ammonium peroxide etch, or a physical etch such as argon sputtering, or a reactive sputter etch such as argon and hydrogen; in an embodiment this etch completely removes the oxide; a modest overetch to ensure complete removal can be implemented; (4) an embodiment deposits a controlled thickness, controlled doping, and controlled-surface-terminated layer of an oxide such as $TiO_x$, $TiO_xN_y$, or other interface layer. Methods such as physical vapor deposition (including, e.g., DC sputtering, RF sputtering, of a $TiO_x$ source, a TiN source, or a Ti source, in the presence of $O_2$, $N_2$, or a combination thereof) can be employed to deposit these layers. Methods also include CVD and ALD where a precursor is first deposited on the surface of the wafer, and a reaction proceeds at a controlled temperature. In cases where $TiO_x$ is to be formed, precursors can be employed.

Manufacturing of a stack or configuration of layers of the device described herein can comprise, for example: (1) Formation of the metal, such as via the sputtering of titanium in a nitrogen atmosphere, resulting in the formation of TiN; (2) In-situ transitioning to the deposition on top of this metal of an interface layer. These can include $TiO_x$ or $TiO_xN_y$. This layer can possess a controlled thickness, controlled doping, and controlled-surface-terminated layer of an oxide such as $TiO_x$, $TiO_xN_y$, or other interface layer. Methods such as physical vapor deposition (including, e.g., DC sputtering, RF sputtering, of a $TiO_x$ source, a TiN source, or a Ti source, in the presence of $O_2$, $N_2$, or a combination thereof) can be employed to deposit these layers. Methods also include CVD and ALD where a precursor is first deposited on the surface of the wafer, and a reaction proceeds at a controlled temperature. In cases where $TiO_x$ is to be formed chemical precursors can be employed.

As described above, an encapsulating and/or passivating layer(s) can be used, above and/or below, the photoconductive layer, to preserve consistent photoconductive features over time. The embodiments described herein ensure a consistent gas environment (or lack of significant presence of a gas) in the photoconductive layer. For example, vacuum, Argon, Nitrogen, Oxygen, Hydrogen, Carbon Dioxide, can be included or excluded, in various proportions and to various degrees. Embodiments can exclude Oxygen, $H_2O$, $CO_2$, and include only either the absence of gas molecules, or nonreactive materials such as Argon and/or Nitrogen. To preserve consistent photoconductive features over time, an encapsulant layer can be included whose purpose is to avoid gas exchange between the photoconductive film and the region exterior to this film. Materials employed in an embodiment for this purpose include but are not limited to: polyxylylene; $As_2S_3$ or $As_2Se_3$; $Si_3N_4$, $SiO_2$, and mixtures thereof, for example, $SiO_xN_y$; oxides such as $TiO_2$, $HfO_2$, $Al_2O_3$, $SiO_2$, $Ta_2O_5$, $Zn_xAl_yO$, $Zn_xGa_yO$, $ZnIn_x$-$Sn_y$.

The encapsulant material can be preceded by a passivation layer, potentially in the form of a substantially single molecular monolayer. This first layer can serve to protect the encapsulated structure during the deposition of the encapsulant: for example, a layer of a material such as polyxylylene can first be deposited, using a procedure that does not deleteriously alter the optoelectronic behavior of the photoconductive layer, and providing protection of the photoconductive layer during ensuing encapsulation processes. It can, for example, protect the film from reactions resultant from oxygen and its radicals that are present during certain processes employed in the deposition of oxygen-containing encapsulants such as $SiO_x$, $SiO_xN_y$, etc.

In embodiments, typical thicknesses of the total encapsulant stack (which can comprise multiple layers) can range from a single monolayer (typically approximately nm or slightly sub-nm, e.g., about 5 Å) to typically about 1 micrometer. In embodiments, typical thicknesses of the total encapsulant stack can be less than about 1 μm to about 2 μm in order to perturb minimally the optical properties of the array.

In embodiments, included in at least one of the layers '1' '2' '3' '4' '5' can be materials that serve to getter molecules that could react with materials in the device, including materials which, if reacted, could alter the photoelectrical properties of the device. Examples of reactive molecules that could enter the device include $O_2$ and $H_2O$ and $O_3$. Examples of materials in the device that could have their photoelectrical properties altered by such reactions include material '4' NC, material '3' adhesion, material '2' interface, and '1' metal. Examples of gettering moieties include borazons, borohydrides including tetrahydroborates, catecholborane, L-selectride, lithium borohydride, lithium triethylborohydride, sodium borohydride, and uranium borohydride. Examples of gettering moieties include hydrolysable siloxanes.

The devices of an embodiment can include a strong chemical bond (e.g., covalent), to the components of the semiconductor photosensitive layer. In case none of the components of the photosensitive layer provide chemical bonding to the interfacial layer the surface of the interfacial layer is modified using organic by-functional molecules, where one type of functional group provides selective bonding to the interfacial layer surface, while the second type of functional group provides bonding to either ligand or directly to semiconductor nanocrystals. These bonding molecules can be formed on non-conductive alkane or aryl backbone or can be formed on conductive backbone including aniline, acytelene, or other types of sp2 hybridized carbon. The functional groups to provide bonding to the oxide can include silanes, siloxanes, silizanes, primary, secondary, or tertiary amines, imides, phosphates, oximes, carboxylates.

Manufacturing processes of the devices of an embodiment can include, for example, a wafer pre-clean using SC1 of about 30 second duration and at 20° C. in a clean dry air ambient. Manufacturing processes of the devices of an embodiment can include a rinse in de-ionized water of about 30 second duration at 20° C. in a clean dry air ambient. Manufacturing processes of the devices of an embodiment can include drying the wafer involving a bake for a prescribed period of time (such as about 30 seconds to about 24 hours) at a prescribed temperature (such as 20° C., 70° C., 150° C., or 200° C.') in a prescribed environment (such as clean dry air, vacuum, nitrogen, argon, or a reducing atmosphere such as hydrogen, or a controlled oxidizing atmosphere containing an inert gas such as $N_2$ or Ar and an oxidizing gas such as $O_2$).

Manufacturing processes of the devices of an embodiment can include the stipulation of maximum and minimum and average queue times in between other processes.

Manufacturing processes of the devices of an embodiment can include treatments of substrates and quantum dot films including exposure to ethanedithiol in acetonitrile at a prescribed temperature, such as about 25° C., for a prescribed time, such as 20 seconds, in a prescribed atmosphere, such as $N_2$. Manufacturing processes of the devices of an embodiment can include treatments of substrates and quantum dot films including exposure to hexanedithiol in acetonitrile at a prescribed temperature, such as about 25° C., for a prescribed time, such as about 20 seconds, in a prescribed atmosphere, such as $N_2$.

Manufacturing processes of the devices of an embodiment can include the deposition of a dielectric capping layer, such as $SiO_2$, at or beneath a certain temperature, such as about 100° C., and to a specified thickness of dielectric capping layer such as 100° C.

Manufacturing processes of the devices of an embodiment can include lithographic definition of areas to be etched, followed by etching of materials, including $SiO_2$.

Manufacturing processes of the devices of an embodiment can include the deposition of a dielectric capping layer, such as SiN, at or beneath a certain temperature, such as 100° C., and to a specified thickness of dielectric capping layer such as 100° C.

Manufacturing processes of the devices of an embodiment can include lithographic definition of areas to be etched, followed by etching of materials, including SiN.

Manufacturing processes of the devices of an embodiment can include, for example, silicon CMOS manufacturing including processing on 200 mm Si wafers and a standard Al/$SiO_2$ material technology at 0.11 micron nodes prior to deposition of the quantum dot layer. The CMOS manufacturing flow can be completed with a patterned metal contact such as TiN.

Manufacturing processes of the devices of an embodiment can include integration of one Cu/TEOS/SiN HM single damascene layer on top of a via layer followed by selective electroless deposition of Ni/Au stack.

Manufacturing processes of the devices of an embodiment can include substrate pre-treatment. Metal electrode and/or dielectric surface modification might be utilized to improve electrical contact or adhesion between the layers. Instead of wet preclean, the wafer might be treated by plasma or by a liquid-phase or vapor-phase process to form adhesion mono layers with controlled barrier height and density of surface states.

Manufacturing processes of the devices of an embodiment can include the deposition of photosensitive films in which tight control over the ambient atmosphere is provided to minimize and/or control the impact of oxygen and moisture on film performance. They can include the use of production tools equipped with $O_2$ and $H_2O$ process monitors. Standard operating procedures can be provided that ensure minimal, or controlled and consistent, exposure of materials (such as quantum dots and layers thereof) to air, including during chemical storage, and transfer of fluids from storage containers to process tool tanks. Manufacturing processes can be compatible with chloroform and other solvents.

Manufacturing processes of the devices of an embodiment can include stabilizing the layer of quantum dots. These can include chemical post-treatment using diluted solutions of dithiols in acetonitrile.

Due to high sensitivity of QF to oxygen and moisture in ambient, the queue time between QF deposition and post-treatments should be reduced or minimized and be done under $N_2$ blanket. The same conditions apply to the queue time between post-treatment B and dielectric cap deposition.

Manufacturing processes of the devices of an embodiment can include the sealing of the QF film from oxygen and moisture diffusion during the lifetime of the device. Low-temperature deposition of $SiO_2$/SiN stack can be employed. Such processes should be performed at a substrate temperature below about 100° C. and at atmospheric pressure or at as high pressure as possible. Other process options can include low-temperature spin-on glass processes or ultra-thin metallic films which will not affect optical transmittance of the capping layers.

Process controls of the devices of an embodiment can include incoming wafer inspection prior to quantum dot film deposition. Inspection steps of an embodiment may include, for example: a) inspection for defect density, such as using bright field inspection; b) metal electrode work function inspection, such as using Ultraviolet Photoelectron Spectroscopy (UPS) (the UPS method process control procedure can be performed on blanket process monitor wafers); and c) leakage current and dielectric voltage breakdown to be performed on TLM (test pixel array) structures. The photoelectric response of devices and film properties can be employed as part of a process control.

In embodiments, material '4' can include a material having a bandgap, and providing for the absorption of light within a range of wavelengths of interest. In embodiments, the photosensitive layer can include materials such as Si, PbS, PbSe, CdS, CdSe, GaAs, InP, InAs, PbTe, CdTe, Ge, $In_2S_3$, $Bi_2S_3$, and combinations thereof. In embodiments, the photosensitive layer can include strongly light-absorbing materials such as porphyrins. In embodiments, the photosensitive layer can include passivating organic ligands such as ethanethiol, ethanedithiol, benzenethiol, benzenedithiol, dibenzenedithiol, pyridine, butylamine.

In embodiments, the photodetectors of an embodiment include photosensitive devices that employ a light-sensitive energetic barrier controlling the flow of at least one type of charge carrier.

In embodiments, the photodetectors can exhibit gain, wherein the ratio of the number of additional units of charge flowing each second to the number of photons impinging on a device each second can exceed unity, for example values lying in the approximately range of about 2 to about 60.

In embodiments, the photodetectors can exhibit a high normalized response, that is to say, a high ratio of photocurrent to dark current even at low light levels. For example, when 150 $nW/cm^2$ of visible light impinge on the photodetectors, the ratio of photocurrent to light current can exceed 20. In general, this value should be as high as possible (while fulfilling other specifications, such as on lag and dark current uniformity and photoresponse uniformity). Values as high as 100 and greater are possible for the normalized response at 150 $nW/cm^2$.

In embodiments, the photodetectors can exhibit a rapid temporal response, with the photo current (including following intense illumination, such as 1 μW/cm² on pixel and greater) settling to a value close to the dark current (such as one least-significant-bit from the dark current) within less than about 1 second. Ideally, the photocurrent settles to this value within one exposure period, which can be ⅕ second, ⅓₀ second, ¹⁄₂₀₀ second, ¹⁄₁₀₀₀ second, or similar.

In embodiments, the current-voltage characteristic in the dark can exhibit, between zero and a first voltage, known as the saturation voltage, a monotonically increasing functional relationship. This range can be referred to as the turn-on phase. The current-voltage can exhibit, between the first voltage and a second, larger voltage, known as the reach-through voltage, a monotonically increasing relationship having a lower average slope than during the zero-to-first-voltage range. This first-to-second-voltage range can be referred to as the saturation range. At voltages greater than the second, or reach-through voltage, the current-voltage relationship can exhibit an increase in slope relative to the first-voltage-to-second-voltage range. This highest-voltage range can be termed the post-reach-through range.

In embodiments, gain can be achieved when, under bias, the time for the flowing charge carrier (for example, electrons) to transit the device (e.g., the time to travel between two contacts, such as between left side-material '1' and right side-material '1' in FIG. 2, or the time to travel between material '1' and material '9' in FIG. 3) exceeds the average lifetime of that charge carrier, when the contact that injects the flowing charge carrier (for example, electrons) also prevents the extraction of the other type of charge carrier, which can be termed the blocked carrier (for example, holes), and when the interface between the contact that provides the flowing charge carrier (for example, electrons) and the semiconductor film provides a low surface recombination velocity for the blocked carrier (for example, holes). This interface can be embodied in material '2' and material '3' in FIG. 1A, material '2' and material '3' in FIG. 2 and also material '7' and material '3' in FIG. 2, and material '2,' material '3,' material '5' and material '8' in FIG. 3.

More particularly, gain can be achieved when, under bias, the time for the flowing charge carrier (for example, electrons) to transit the device exceeds the average lifetime of that charge carrier. Quantitatively, it can be said that the base transport factor, alpha_t, is less than but close to unity. This can be achieved if the minority carrier diffusion length for the flowing carrier exceeds the separation between the interface layers.

Furthermore, gain can be achieved when, under bias, the contact that injects the flowing charge carrier (for example, electrons) also prevents the extraction of the other type of charge carrier, which can be termed the blocked carrier (for example, holes). Quantitatively, it can be said that the emitter injection efficiency, gamma, is less than but close to about unity. This can be achieved by using an interface layer near the flowing-carrier-injecting contact that blocks the extraction of the other type of charge carrier. This can be achieved by making the interface layer from a large-bandgap material in which one band (such as the conduction band) is substantially closely aligned in energy with the work function of the metal contact with which it is proximate; and which is substantially misaligned in energy with the band in the semiconductor from which it is to block the extraction of charge carriers.

Moreover, gain can be achieved when, under bias, the interface between the contact that provides the flowing charge carrier (for example, electrons) and the semiconductor film provides a low surface recombination velocity for the blocked carrier (for example, holes). Quantitatively, it can be said that the recombination factor is less than, but close to, about unity. This can be achieved if, within the minority carrier lifetime of the flowing carrier (for example, electrons), only a small fraction of the blocked-carrier (for example, holes) recombine near the interface between the contact that provides the flowing charge carrier (for example, electrons) and the semiconductor film. This can require that the surface recombination velocity for the blocked carrier be less than about 0.1 cm/s, for example about 0.01 cm/s or less.

Referring to FIG. 2, embodiments can include methods and structures taken to reduce the dark current passing between leftmost material '1' and rightmost material '1.' Embodiments can include the removal of conductive moieties in the portion of material '3' that reside between the contacts leftmost material '1' and rightmost material '1.' Embodiments can include the removal of conductive moieties such as metal oxides, metal hydroxides, organic contamination, polymer, and conductive oxides that reside between the contacts leftmost material '1' and rightmost material '1.' Referring to FIG. 2, embodiments can include the modification of the interface between material '7' and material '4' in order to control the recombination rate, the trapped charge, the adhesion, or a plurality of such properties at this interface.

Referring again to FIG. 1A, embodiments include controlling surface states such as those present in interface layers '2' and '3.' Embodiments include striking a metal such as TiN in material '1' or a metal hydroxide such as $TiO_x$ in material '2' with xenon or other species or employing argon sputtering in order to control or modify the recombination rate on the surface. Embodiments can include reducing the surface recombination velocity for charge carriers of one type to less than about 0.1 cm/s or to less than about 0.01 cm/s at this interface.

Embodiments include the realization of small pixels with a pixel pitch of about 0.9 μm in each lateral dimension. Embodiments include the use of narrow vias such as about 0.15 μm. Embodiments include the use of metal-to-metal spacings of about 0.14 μm.

Embodiments described herein include an optically sensitive device comprising, for example: a first contact and a second contact, each having a work function; an optically sensitive material between the first contact and the second contact, the optically sensitive material comprising a p-type semiconductor, and the optically sensitive material having a work function; circuitry configured to apply a bias voltage between the first contact and the second contact; the magnitude of the work function of the optically sensitive material being at least about 0.4 eV greater than the magnitude of the work function of the first contact, and also at least about 0.4 eV greater than the magnitude of the work function of the second contact; the optically sensitive material having an electron lifetime that is greater than the electron transit time from the first contact to the second contact when the bias is applied between the first contact and the second contact; the first contact providing injection of electrons and blocking the extraction of holes; the interface between the first contact and the optically sensitive material providing a surface recombination velocity less than about 1 cm/s.

Embodiments described herein include an optically sensitive device comprising, for example: a first contact; an n-type semiconductor; an optically sensitive material comprising a p-type semiconductor; a second contact; the optically sensitive material and the second contact each having a work function shallower than about 4.5 eV; circuitry configured to apply a bias voltage between the first contact and the second contact; the optically sensitive material having an electron lifetime that is greater than the electron transit time from the first contact to the second contact when the bias is applied between the first contact and the second contact; the first contact providing injection of electrons and blocking the extraction of holes; the interface between the first contact and the optically sensitive material providing a surface recombination velocity less than about 1 cm/s.

Embodiments described herein include a photodetector comprising, for example: a first contact and a second contact, each having a work function; an optically sensitive material between the first contact and the second contact, the optically sensitive material comprising a p-type semiconductor, and the optically sensitive material having a work function; circuitry configured to apply a bias voltage between the first contact and the second contact; the magnitude of the work function of the optically sensitive material being at least about 0.4 eV greater than the magnitude of the work function of the first contact, and also at least about 0.4 eV greater than the magnitude of the work function of the second contact; circuitry configured to apply a bias voltage between the first contact and the second contact; and the optically sensitive material configured to provide a responsivity of at least about 0.8 A/W when the bias is applied between the first contact and the second contact.

The first contact of the photodetector of an embodiment is an injecting contact and the second contact is a withdrawing contact.

The injecting contact of the photodetector of an embodiment is configured to inject a flowing carrier into the optically sensitive material with greater efficiency than the injecting contact withdraws a trapped carrier from the optically sensitive material.

The injecting contact of the photodetector of an embodiment is configured to withdraw a flowing carrier from the optically sensitive material with greater efficiency than the withdrawing carrier injects a trapped carrier into the optically sensitive material.

The optically sensitive material of the photodetector of an embodiment is a p-type semiconductor material.

The first contact of the photodetector of an embodiment comprises metal and wherein the second contact comprises metal.

The bias of the photodetector of an embodiment is in the range of about −0.1 Volts to about −2.8 Volts and the flowing carrier is electrons.

The optically sensitive material of the photodetector of an embodiment comprises nanoparticles selected from the group consisting of PbS, PbSe, PbTe, CdS, CdSe, CdTe, Si, Ge, or C.

Each nanoparticle of the photodetector of an embodiment includes an oxide on the surface of the nanoparticle.

An optically sensitive layer of the photodetector of an embodiment comprises a material selected from the group consisting of $PbSO_4$, PbO, $PbSeO_4$, $PbTeO_4$, $SiO_xN_y$, $In_2O_3$, sulfur, sulfates, sulfoxides, carbon, and carbonates.

The nanoparticles of the photodetector of an embodiment are interconnected.

The injecting contact and the withdrawing contact of the photodetector of an embodiment each comprise a material selected from the group consisting of Al, Ag, In, Mg, Ca, Li, Cu, Ni, NiS, TiN, or TaN.

The optically sensitive layer of the photodetector of an embodiment has a dimension perpendicular to the direction of incident of light in the range of from about 100 nm to about 3000 nm.

A first carrier type of the photodetector of an embodiment is in the majority in the dark and a second carrier type is in the majority under illumination.

The first carrier type of the photodetector of an embodiment is holes and the second carrier type is electrons.

The first contact and the second contact of the photodetector of an embodiment comprise a shallow-work function metal.

The first contact and the second contact of the photodetector of an embodiment comprise each have a work function shallower than about 4.5 eV.

The distance between the first contact and the second contact of the photodetector of an embodiment is in the range of about 200 nm to about 2 μm.

The flowing carrier of the photodetector of an embodiment has a mobility of at least of at least about 1E-5 $cm^2/Vs$.

The p-type semiconductor material of the photodetector of an embodiment is a doped p-type material.

The bias of the photodetector of an embodiment is in the range of about +0.1 Volts to about +2.8 Volts and the flowing carrier is holes.

The injecting contact and the withdrawing contact of the photodetector of an embodiment each comprise a material selected from the group consisting of Au, Pt, Pd, Cu, Ni, NiS, TiN, and TaN.

A first carrier type of the photodetector of an embodiment is in the majority in the dark and a second carrier type of the photodetector of an embodiment is in the majority under illumination.

The first carrier type of the photodetector of an embodiment is electrons and the second carrier type is holes.

The first contact and the second contact of the photodetector of an embodiment comprise a deep-work function metal.

The first contact and the second contact of the photodetector of an embodiment comprise each have a work function deeper than about 4.5 eV.

The n-type semiconductor material of the photodetector of an embodiment is a doped n-type material.

The optically sensitive material of the photodetector of an embodiment has a work function deeper than the work function of the first contact and the second contact by at least about 0.3 eV.

The first contact and the second contact of the photodetector of an embodiment each comprise a material selected from the group consisting of Al, Ag, In, Mg, Ca, Li, Cu, Ni, NiS, TiN, TaN, n-type polysilicon, and n-type amorphous silicon.

Embodiments described herein include a photodetector comprising, for example: a first contact and a second contact; an optically sensitive material between the first contact and the second contact, the optically sensitive material comprising an n-type semiconductor; the first contact and the second contact each having a work function deeper than about 4.5 eV; circuitry configured to apply a bias voltage between the first contact and the second contact; and the optically sensitive material configured to provide a photoconductive gain and a responsivity of at least about 0.4 A/W when the bias is applied between the first contact and the second contact.

The optically sensitive material of the photodetector of an embodiment has a work function shallower than the work function of the first contact and the second contact by at least about 0.3 eV.

The first contact and the second contact of the photodetector of an embodiment each comprise a material selected from the group consisting of Au, Pt, Pd, Cu, Ni, NiS, TiN, TaN, p-type polysilicon, and p-type amorphous silicon.

Embodiments described herein include a phototransistor comprising, for example: a first contact and a second contact; an optically sensitive material between the first contact and the second contact, the optically sensitive material comprising an n-type semiconductor; the first contact and the second contact each having a Schottky contact or work function deeper than about 4.5 eV; circuitry configured to apply a bias voltage between the first contact and the second contact; and the optically sensitive material having a hole lifetime that is greater than the hole transit time from the first contact to the second contact when the bias is applied between the first contact and the second contact.

The flowing carrier of the photodetector of an embodiment is holes and the trapped carrier is electrons.

Embodiments described herein include a phototransistor comprising, for example: a first contact and a second contact; an optically sensitive material between the first contact and the second contact, the optically sensitive material comprising a p-type semiconductor; the first contact and the second contact each having a Schottky contact or work function shallower than about 4.5 eV; circuitry configured to apply a bias voltage between the first contact and the second contact; and the optically sensitive material having an electron lifetime when the bias is applied between the first contact and the second contact; wherein the electron mobility of the optically sensitive material, the distance between the first contact and the second contact and the bias voltage are selected such that the electron transit time from the first contact to the second contact is less than the electron lifetime when the bias is applied between the first contact and the second contact.

The flowing carrier of the photodetector of an embodiment is electrons and the trapped carrier is holes.

Embodiments described herein include a phototransistor comprising, for example: a first contact and a second contact; an optically sensitive material between the first contact and the second contact, the optically sensitive material comprising an n-type semiconductor; the first contact and the second contact each having a Schottky contact or work function deeper than about 4.5 eV; circuitry configured to apply a bias voltage between the first contact and the second contact; the optically sensitive material having a hole lifetime when the bias is applied between the first contact and the second contact; wherein the hole mobility of the optically sensitive material, the distance between the first contact and the second contact and the bias voltage are selected such that the hole transit time from the first contact to the second contact is less than the hole lifetime when the bias is applied between the first contact and the second contact.

The flowing carrier of the photodetector of an embodiment is holes and the trapped carrier is electrons.

The photodetector of an embodiment comprises a p-type semiconductor comprising p-doped silicon.

The photodetector of an embodiment comprises a p-type semiconductor comprising GaAs.

The photodetector of an embodiment comprises a p-type semiconductor comprising quantum dots/nanocrystals.

The photodetector of an embodiment comprises a p-type semiconductor comprising a network of interconnected nanocrystals.

The photodetector of an embodiment comprises a p-type semiconductor comprising nanocrystals and linker molecules.

The photodetector of an embodiment comprises a p-type semiconductor comprising a compound semiconductor.

The photodetector of an embodiment comprises a p-type semiconductor comprising PbS, PbS with $PBSO_3$.

Embodiments described herein include an optically sensitive device comprising, for example: a first contact and a second contact, each having a work function; an optically sensitive material between the first contact and the second contact, the optically sensitive material comprising a p-type semiconductor, and the optically sensitive material having a work function; circuitry configured to apply a bias voltage between the first contact and the second contact; the magnitude of the work function of the optically sensitive material being at least about 0.4 eV greater than the magnitude of the work function of the first contact, and also at least about 0.4 eV greater than the magnitude of the work function of the second contact; the optically sensitive material having an electron lifetime that is greater than the electron transit time from the first contact to the second contact when the bias is applied between the first contact and the second contact; the first contact providing injection of electrons and blocking the extraction of holes; and the interface between the first contact and the optically sensitive material providing a surface recombination velocity less than about 1 cm/s.

The work function of the first contact and the second contact of the device of an embodiment are each shallower than about 4.5 eV.

The bias of the device of an embodiment is in the range of about −0.1 Volts to about −2.8 Volts.

The optically sensitive material of the device of an embodiment comprises a plurality of nanoparticles, wherein each of the nanoparticles has an oxide on a surface of the respective nanoparticle.

The optically sensitive material of the device of an embodiment comprises nanoparticles selected from the group consisting of PbS, PbSe, PbTe, CdS, CdSe, CdTe, Si, Ge, or C.

The optically sensitive layer of the device of an embodiment comprises a material selected from the group consisting of $PbSO_4$, PbO, $PbSeO_4$, $PbTeO_4$, $SiO_xN_y$, $In_2O_3$, sulfur, sulfates, sulfoxides, carbon, and carbonates.

The optically sensitive material of the device of an embodiment comprises a plurality of interconnected nanoparticles.

The first contact and the second contact of the device of an embodiment each comprise a material selected from the group consisting of Al, Ag, In, Mg, Ca, Li, Cu, Ni, NiS, TiN, or TaN, $TiO_2$, $Ti_xN_y$, ITO, Ru, TiSi, $WSi_2$, $TiO_x$ doped with B, $TiO_x$ doped with C, $TiO_x$ doped with Co, $TiO_x$ doped with Fe, $TiO_x$ doped with Nd, $TiO_x$ doped with N.

The first contact and the second contact of the device of an embodiment are separated by a distance in the range of about 200 nm to about 2 μm and the electron mobility in the optically sensitive material is at least about 1E-5 $cm^2/Vs$.

The optically sensitive material of the device of an embodiment is configured to provide a responsivity of at least about 0.8 A/W when the bias is applied between the first contact and the second contact.

Embodiments described herein include an optically sensitive device comprising, for example: a first contact; an n-type semiconductor; an optically sensitive material comprising a p-type semiconductor; a second contact; the magnitude of the work function of the optically sensitive material being at least about 0.4 eV greater than the magnitude of the work function of the second contact; the optically sensitive material having an electron lifetime that is greater than the electron transit time from the first contact to the second contact when the bias is applied between the first contact and the second contact; the n-type semiconductor providing injection of electrons and blocking the extraction of holes; and the interface between the n-type semiconductor and the optically sensitive material providing a surface recombination velocity less than 1 cm/s.

The n-type semiconductor of the device of an embodiment comprises a material selected from the group consisting of $TiO_2$, $TiO_2$ that has been chemically reduced, $TiO_2$ that has been oxidized, CdTe, CdS, CdSe, Si, or nanoparticles selected from the group consisting of PbS, PbSe, PbTe, CdS, CdSe, CdTe, Si, Ge, or C.

The bias of the device of an embodiment is in the range of about −0.1 Volts to about −2.8 Volts.

The optically sensitive material of the device of an embodiment comprises a plurality of nanoparticles, wherein each of the nanoparticles has an oxide on a surface of the respective nanoparticle.

The optically sensitive material of the device of an embodiment comprises nanoparticles selected from the group consisting of PbS, PbSe, PbTe, CdS, CdSe, CdTe, Si, Ge, or C.

The optically sensitive material of the device of an embodiment comprises a plurality of interconnected nanoparticles.

The first contact and the second contact of the device of an embodiment are separated by a distance in the range of about 200 nm to about 2 µm.

The first contact and the second contact of the device of an embodiment each comprise a material selected from the group consisting of Al, Ag, In, Mg, Ca, Li, Cu, Ni, NiS, TiN, TaN, $TiO_2$, $Ti_xN_y$, ITO, Ru, TiSi, $WSi_2$, $TiO_x$ doped with B, $TiO_x$ doped with C, $TiO_x$ doped with Co, $TiO_x$ doped with Fe, $TiO_x$ doped with Nd, $TiO_x$ doped with N.

Embodiments described herein include a photodetector comprising, for example: a first contact and a second contact, each having a work function; an optically sensitive material between the first contact and the second contact, the optically sensitive material comprising a p-type semiconductor, and the optically sensitive material having a work function; circuitry configured to apply a bias voltage between the first contact and the second contact; the magnitude of the work function of the optically sensitive material being at least about 0.4 eV greater than the magnitude of the work function of the first contact, and also at least about 0.4 eV greater than the magnitude of the work function of the second contact; circuitry configured to apply a bias voltage between the first contact and the second contact; and the optically sensitive material configured to provide a responsivity of at least about 0.8 A/W when the bias is applied between the first contact and the second contact.

The work function of the first contact and the second contact of the photodetector of an embodiment are each shallower than about 4.5 eV.

The bias of the photodetector of an embodiment is in the range of about −0.1 Volts to about −2.8 Volts.

The optically sensitive material of the photodetector of an embodiment comprises nanoparticles selected from the group consisting of PbS, PbSe, PbTe, CdS, CdSe, CdTe, Si, Ge, or C.

The optically sensitive layer of the photodetector of an embodiment comprises a material selected from the group consisting of $PbSO_4$, PbO, $PbSeO_4$, $PbTeO_4$, $SiO_xN_y$, $In_2O_3$, sulfur, sulfates, sulfoxides, carbon, and carbonates.

The first contact and the second contact of the photodetector of an embodiment each comprise a material selected from the group consisting of Al, Ag, In, Mg, Ca, Li, Cu, Ni, NiS, TiN, TaN, $TiO_2$, $Ti_xN_y$, ITO, Ru, TiSi, $WSi_2$, $TiO_x$ doped with B, $TiO_x$ doped with C, $TiO_x$ doped with Co, $TiO_x$ doped with Fe, $TiO_x$ doped with Nd, $TiO_x$ doped with N.

The first contact and the second contact of the photodetector of an embodiment are separated by a distance in the range of about 200 nm to about 2 µm and the electron mobility in the optically sensitive material is at least 1E-5 $cm^2/Vs$.

Embodiments described herein include an optically sensitive device comprising, for example: a first contact and a second contact, each having a work function; an optically sensitive material between the first contact and the second contact, the optically sensitive material comprising a N-type semiconductor, and the optically sensitive material having a work function; circuitry configured to apply a bias voltage between the first contact and the second contact; the magnitude of the work function of the optically sensitive material being at least about 0.4 eV less than the magnitude of the work function of the first contact, and also at least about 0.4 eV less than the magnitude of the work function of the second contact; the optically sensitive material having a hole lifetime that is greater than the hole transit time from the first contact to the second contact when the bias is applied between the first contact and the second contact; the first contact providing injection of holes and blocking the extraction of electrons; and the interface between the first contact and the optically sensitive material providing a surface recombination velocity less than about 1 cm/s.

The work function of the first contact and the second contact of the device of an embodiment are each deeper than about 4.5 eV.

The bias of the device of an embodiment is in the range of about 0.1 Volts to about 2.8 Volts.

The optically sensitive material of the device of an embodiment comprises a plurality of nanoparticles, wherein each of the nanoparticles has an oxide on a surface of the respective nanoparticle.

The optically sensitive material of the device of an embodiment comprises nanoparticles selected from the group consisting of PbS, PbSe, Pb Te, CdS, CdSe, CdTe, Si, Ge, or C.

The optically sensitive layer of the device of an embodiment comprises a material selected from the group consisting of $PbSO_4$, PbO, $PbSeO_4$, $PbTeO_4$, $SiO_xN_y$, $In_2O_3$, sulfur, sulfates, sulfoxides, carbon, and carbonates.

The optically sensitive material of the device of an embodiment comprises a plurality of interconnected nanoparticles.

The first contact and the second contact of the device of an embodiment each comprise a material selected from the group consisting of Au, Pd, Pt, Ag, In, Cu, Ni, NiS, NiSi, PtSi, TiN, or TaN.

The first contact and the second contact of the device of an embodiment are separated by a distance in the range of about 200 nm to about 2 µm and the hole mobility in the optically sensitive material is at least 1 E-5 $cm^2/Vs$.

The optically sensitive material of the device of an embodiment provides a responsivity of at least 0.8 A/W when the bias is applied between the first contact and the second contact.

Embodiments described herein include an optically sensitive device comprising, for example: a first contact; a p-type semiconductor; an optically sensitive material comprising an n-type semiconductor; a second contact; the magnitude of the work function of the optically sensitive material being at least about 0.4 eV less than the magnitude of the work function of the second contact; the optically sensitive material having a hole lifetime that is greater than the hole transit time from the first contact to the second contact when the bias is applied between the first contact and the second contact; the p-type semiconductor providing injection of holes and blocking the extraction of electrons; and the interface between the p-type semiconductor and the optically sensitive material providing a surface recombination velocity less than about 1 cm/s.

The p-type semiconductor of the device of an embodiment comprises a material selected from the group consisting of $TiO_2$, $TiO_2$ that has been chemically reduced, $TiO_2$ that has been oxidized, CdTe, CdS, CdSe, Si, or nanoparticles selected from the group consisting of PbS, PbSe, Pb Te, CdS, CdSe, Cd Te, Si, Ge, or C.

The bias of the device of an embodiment is in the range of about 0.1 Volts to about 2.8 Volts.

The optically sensitive material of the device of an embodiment comprises a plurality of nanoparticles, wherein each of the nanoparticles has an oxide on a surface of the respective nanoparticle.

The optically sensitive material of the device of an embodiment comprises nanoparticles selected from the group consisting of PbS, PbSe, Pb Te, CdS, Cd Se, Cd Te, Si, Ge, or C.

The optically sensitive material of the device of an embodiment comprises a plurality of interconnected nanoparticles.

The first contact and the second contact of the device of an embodiment are separated by a distance in the range of about 200 nm to about 2 μm.

The first contact and the second contact of the device of an embodiment each comprise a material selected from the group consisting of Au, Pd, Pt, Ag, In, Cu, Ni, NiS, NiSi, PtSi, TiN, or TaN.

Embodiments described herein include a photodetector comprising, for example: a first contact and a second contact, each having a work function; an optically sensitive material between the first contact and the second contact, the optically sensitive material comprising an n-type semiconductor, and the optically sensitive material having a work function; circuitry configured to apply a bias voltage between the first contact and the second contact; the magnitude of the work function of the optically sensitive material being at least about 0.4 eV less than the magnitude of the work function of the first contact, and also at least about 0.4 eV less than the magnitude of the work function of the second contact; circuitry configured to apply a bias voltage between the first contact and the second contact; and the optically sensitive material configured to provide a responsivity of at least about 0.8 A/W when the bias is applied between the first contact and the second contact.

The work function of the first contact and the second contact of the device of an embodiment are each deeper than about 4.5 eV.

The bias of the device of an embodiment is in the range of about 0.1 Volts to about 2.8 Volts.

The optically sensitive material of the device of an embodiment comprises nanoparticles selected from the group consisting of PbS, PbSe, Pb Te, CdS, CdSe, CdTe, Si, Ge, or C.

The optically sensitive layer of the device of an embodiment comprises a material selected from the group consisting of $PbSO_4$, PbO, $PbSeO_4$, $PbTeO_4$, $SiO_xN_y$, $In_2O_3$, sulfur, sulfates, sulfoxides, carbon, and carbonates.

The first contact and the second contact of the device of an embodiment each comprise a material selected from the group consisting of Au, Pd, Pt, Ag, In, Cu, Ni, NiS, NiSi, PtSi, TiN, or TaN.

The first contact and the second contact of the device of an embodiment are separated by a distance in the range of about 200 nm to about 2 μm and the hole mobility in the optically sensitive material is at least about 1 E-5 $cm^2/Vs$.

In various embodiments, the device enables a feature referred to herein as a "global shutter," in which under appropriate biasing of the device as discussed below, collection of photocurrent can selectively be turned on and off. The layers referenced in the following discussion correspond to those in the materials stack that is illustrated in FIG. 3 (e.g., '1,' '2,' '4,' '8,' and '9'). During the "on" phase of global shutter, in embodiments, a bias can be applied across the stack such that a positive voltage is applied to the material '1' side of the stack and a negative voltage is applied to the material '9' side of the stack. When light is absorbed in material '4,' electron-hole pairs are generated. The bias across the stack causes the transit of electrons to the more positive electrode, material '1,' and holes toward the more negative electrode, material '9,' which results in photocurrent that can be detected by a read-out integrated circuit and used to generate a digital image.

In embodiments, the stack can also be turned "off," with the appropriate biasing, as discussed below. Referring to the layers in FIG. 3, in embodiments the speed with which the electrons and holes transit light absorbing layer, material '4,' can depend strongly on the electric field in material '4.' In embodiments, the electric field in material '4' can depend non-linearly on the voltage bias across the stack, such that with a large bias, for example greater than about 1 V, the electric field in material '4' can be large enough to quickly transport all electrons and holes out of material '4,' generating photocurrent. In this scenario, the stack is considered "on." In embodiments, when the bias across the stack is smaller, for example less than about 1V, there is much less electric field in material '4,' such that electrons and holes transit material '4' very slowly. When they transit material '4' so slowly, their recombination lifetime can be much less than the transport time, such that the photocurrent is reduced to near zero. In this state, the stack is considered "off," because no photocurrent is collected at the electrodes.

The shutter efficiency can be defined as the ratio of photocurrent when the stack is biased such that it is "on" to the photocurrent when the stack is biased such that it is "off" In embodiments, the shutter efficiency can be greater than about 100 dB.

Referring to the layers in FIG. 3, in embodiments "global shutter" can be achieved by alternating the bias applied to material '9' to toggle the device from the "on" state to the "off" state. A bias is applied to material '9' such that the device is "on" for a fixed amount of time. During this time, photocurrent can be collected at the electrode of material '1.' At the end of this time, the bias of material '9' can rapidly be changed such that the device is in the "off" state. In the "off" state, photocurrent is no longer collected at the electrode of material '1,' and the conversion of light to a digital signal has been halted. In the "off" state, the signal read out by the image sensor is insensitive the light incident upon it.

In embodiments, the appropriate choice of stack materials of FIG. 3 can substantially change the range of biases over which the stack is in the "off" state. For embodiments where the stack is coupled with a read-out integrated circuit for use as an image sensor, it can be important that the range of biases over which the stack is in the "off" state be large. This is because in some embodiments of image sensors, the bias of one electrode is used to signal the magnitude of the photocurrent being generated, by integrating the collected photogenerated charge. In embodiments where photogenerated electrons transit material '9' toward material '1,' the voltage of material '1' begins at a more positive value, and is reduced to a lower value with the collection of electrons.

Figure 5A:
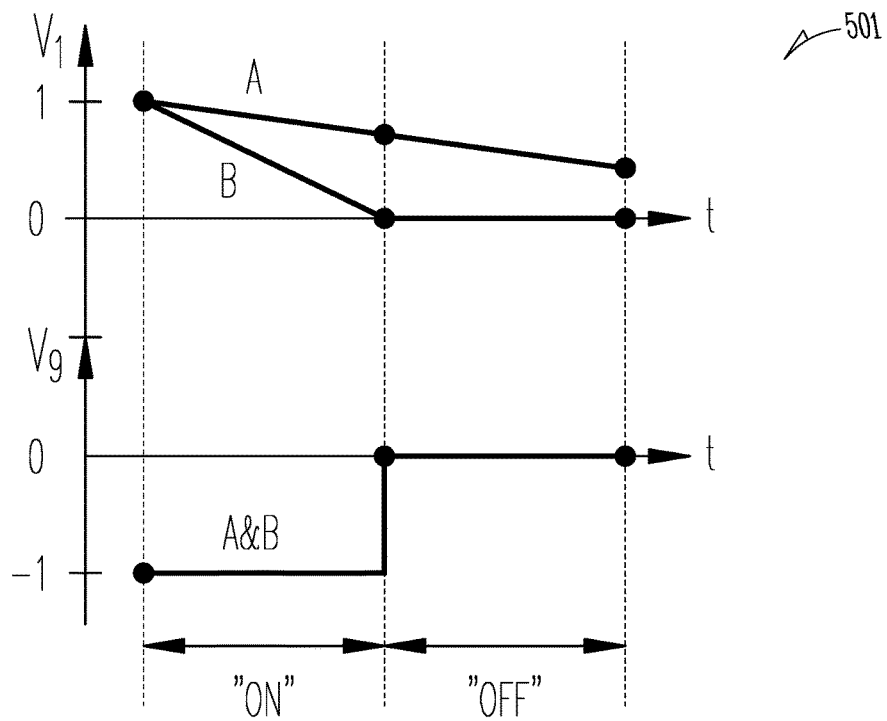
FIGS. 5A and 5B show graphs of embodiments where the voltage of the pixel does change with photocurrent collection.
Figure 5B:
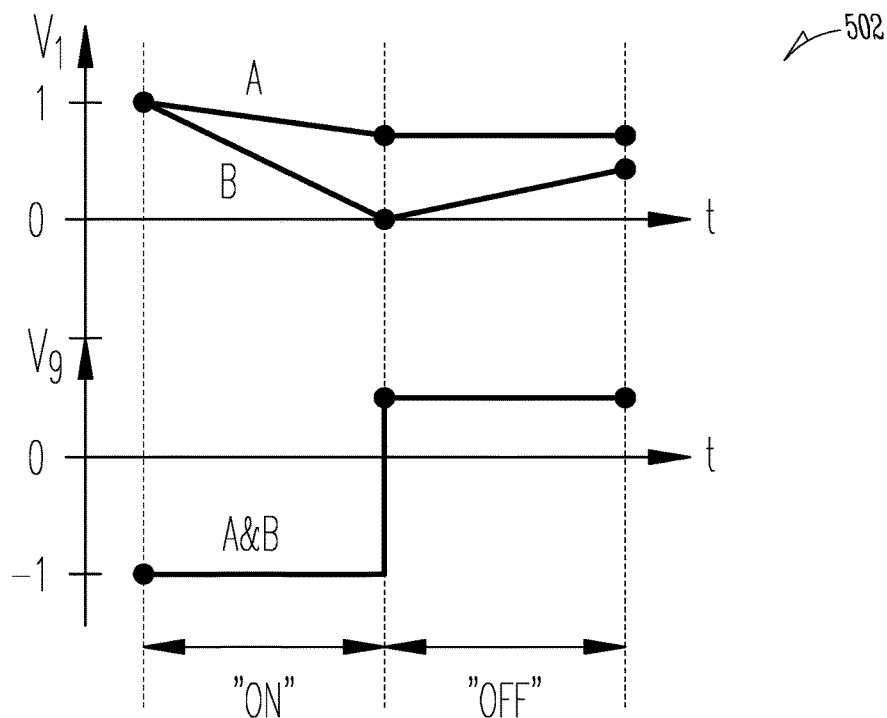

An example of such an embodiment is shown in FIGS. 5A and 5B, which shows the voltages of material '9' ($V_9$) and material '1' ($V_1$) over time for two different pixels, where the labeling of the materials corresponds to that of FIG. 3. Pixel A is illuminated with dim light, while Pixel B is illuminated with bright light. Under brighter light, the photocurrent becomes larger, and the voltage of material '1,' is reduced in a shorter amount of time. Put another way, for a given amount of time when the stack is in the "on" state, a brighter light will cause the voltage of material '1' to be lower (less positive), than a dim light or no light. In embodiments, a "bright light" can be one where the voltage of material '1' changes by greater than about 1 V during the "on" period, and has a photon flux of approximately $8 \times 10^{12}$ $cm^{-2}$ $s^{-1}$. In embodiments, a "dim light" can be one where the voltage of material '1' changes by less than about 0.25 V during the "on" period, and has a photon flux of approximately $2 \times 10^{12}$ $cm^{-2}$ $s^{-1}$.

Figure 4:
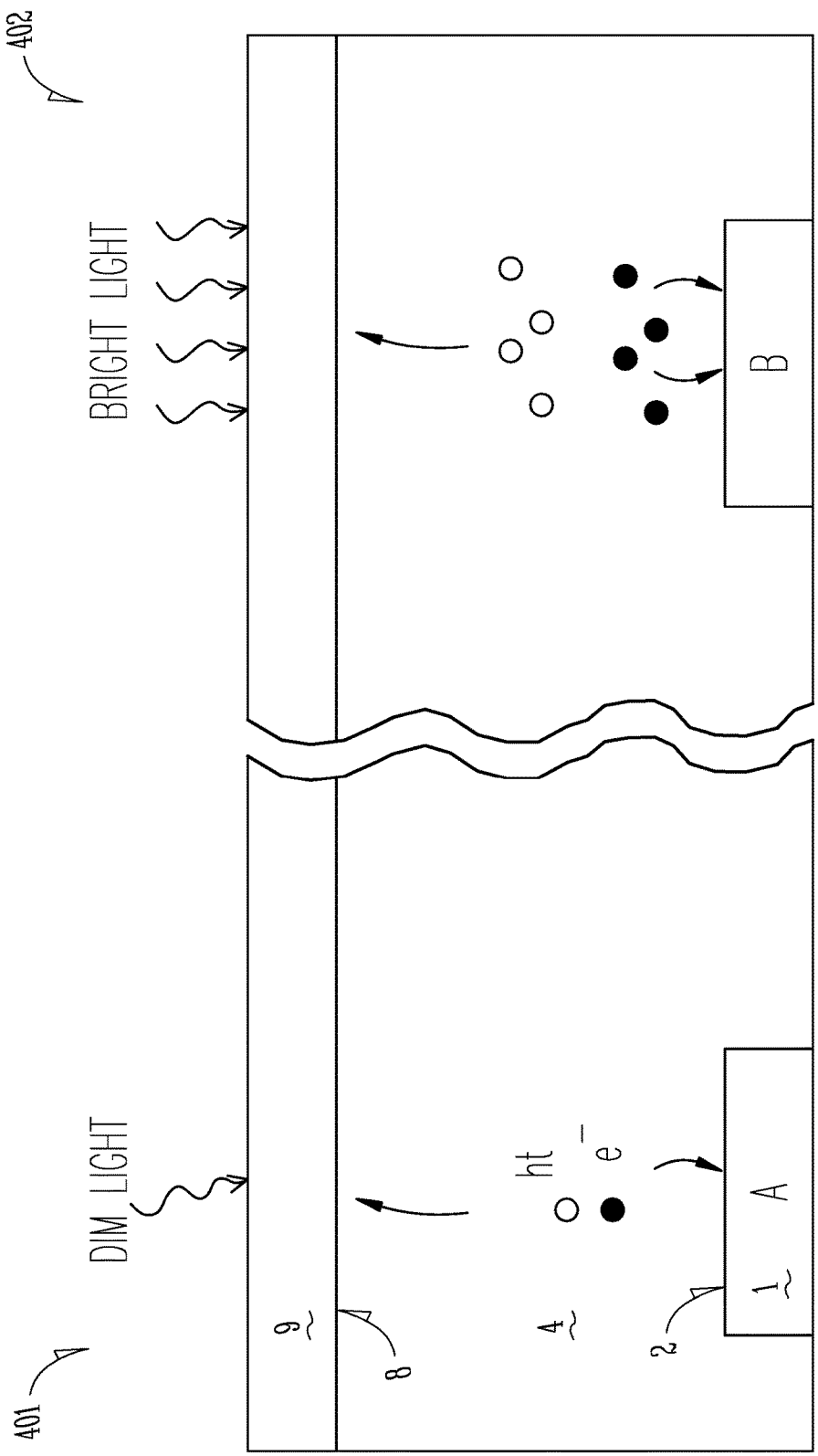
FIG. 4 shows a cross-section of an embodiment of the disclosed subject matter with two pixels.

In embodiments with image sensors, material '1' of FIG. 3 can be patterned into two or more individual pixels, such that an image can be spatially resolved. This is shown schematically in FIG. 4, which shows a cross-section of an embodiment with two pixels. The labeling of the materials in the stack of FIG. 4 (e.g., '1,' '2,' '4,' '8,' '9') corresponds that of FIG. 3. The two pixels, which are not necessarily adjacent to each other within an array of pixels, are exposed to different amounts of light. In FIG. 4, Pixel A 401 is exposed to dim light, and corresponds to curve A in FIGS. 5A and 5B, while Pixel B 402 in FIG. 4 is exposed to bright light, and corresponds to curve B in FIGS. 5A and 5B. In such embodiments, material '9' can be un-patterned such that it is common to all of the pixels in the array. In such embodiments, the voltages of each pixel composed of material '1' can be independent, while the voltage of material '9' can be common to all of the pixels.

In embodiments, the electric field in material '4' is generated by biasing independent features of the same layer. In embodiments, material '1' can be patterned into one or more features, and one feature is biased positively while a neighboring feature is biased negatively. The relative bias of the two features may be toggled to turn the device from "on" to "off" states.

In embodiments with image sensors imaging a high dynamic range scene, the pixels made from material '1' can have a range of voltages at the end of a fixed integration time. Pixels exposed to a bright part of the image, which produces a higher amount of photocurrent, can have a more negative voltage than pixels exposed to a dim part of the image, which produces very little (or no) photocurrent. At the end of the integration period, the voltage of material '9' can be changed in order to switch the device from the "on" to the "off" state. When an image sensor has such a range of pixel voltages at the end of the integration period, there is no single, common voltage that can be applied to material '9' such that there is zero bias between material '9' and all independent pixels formed by material '1.'

An example of this is illustrated by graph 501 of FIG. 5A. At the beginning of the "on" period, both pixels A and B begin with a material '1' voltage ($V_1$) of 1.0 V. Pixel B sees bright light, while pixel A sees only dim light. At the end of the "on" period, pixel B has collected a large number of photogenerated electrons, such that its voltage has dropped to 0.0 V. By contrast, pixel A was in dim light, and has collected only a small number of photogenerated electrons; its voltage has dropped very little and is 0.75 V. The voltage of material '9' to turn the device "off" has been chosen to be 0.0V, in FIG. 5A. When the voltage of material '9' is switched to be 0.0 V, the voltage across pixel B, the bright pixel, will be $\Delta V_B = V_{1B} - V_9 = 0.0 V - 0.0 V = 0.0 V$, such that pixel B is perfectly in the "off" state. By contrast, the bias across pixel A, the dim pixel, will be $\Delta V_A = V_{1A} - V_9 = 0.75 V - 0.0 V = 0.75 V$, such that pixel A still has a driving force for the collection of photogenerated electrons at material '1'; it may not be perfectly "off."

On the other hand, in the example of FIG. 5A, if the voltage of material '9' is chosen such that it matches the voltage of the dim pixel (pixel A), then the dim pixel will be perfectly "off" but the bright pixel can still have a bias driving the collection of photocurrent.

In the example illustrated by graph 502 of FIG. 5B, the voltage of material '9' during the "off" phase is chosen to be 0.75 V. Now the bias across pixel A, the dim pixel, will be $\Delta V_A = V_{1A} - V_9 = 0.75 V - 0.75 V = 0.0 V$, and pixel A will be perfectly "off" By contrast, the bias across pixel B, the bright pixel, will be $\Delta V_B = V_{1B} - V_9 = 0.0 V - 0.75 V = -0.75 V$; pixel B now has a bias such that it can collect photogenerated holes, and may not be perfectly "off."

Figure 7:
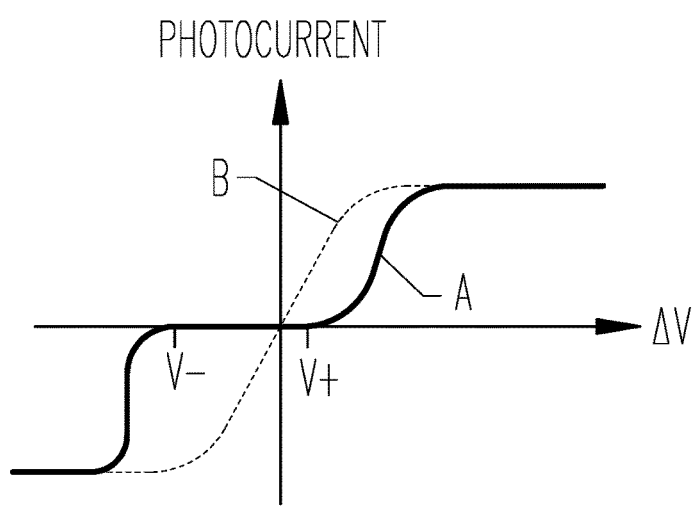
FIG. 7 shows a graph of photocurrent versus voltage curves.

In embodiments, the device is engineered such that the collection of photocurrent is close to zero for a wide range of biases across the device. In embodiments with a high dynamic range image, this allows bright and dim pixels to both be turned "off" with a high shutter efficiency for a single common choice of voltage applied to material '9.' This is illustrated in FIG. 7, which shows photocurrent versus voltage curves for two different embodiments. The voltage on the x-axis of in FIG. 7 ($\Delta V$), is the difference in potentials between material '1' and material '9' of FIG. 3 ($\Delta V = V_1 - V_9$). The device of curve B shows only a single bias for which the photocurrent is zero ($\Delta V = 0$ V). For this embodiment, any pixel that does not have 0 V bias across it can have substantial photocurrent collection. For such embodiments, a good circuit to read out the generated photocurrent is one where the voltage of the pixel does not change as photocurrent is collected. However, in embodiments where the voltage of the pixel does change with photocurrent collection, such as that illustrated in FIGS. 5A and 5B, not all of the pixels of a high dynamic range image will be "off" By contrast, the device of curve A in FIG. 7 shows that the photocurrent is near zero for a wide range of biases ($V_+$ to $V_-$); this embodiment is said to have a "wide flat region" in its photocurrent versus voltage curve. In embodiments where the voltage of the pixel changes as photocurrent is collected, the device in this embodiment can support a high dynamic range image and still have all the pixels be "off" Such an embodiment can support a range of pixel voltages equal to ($V_+$ to $V_-$), which is the width of the flat region in FIG. 7. In embodiments, the photocurrent across the range of biases ($V_+$ to $V_-$) can be up to about 100 dB less than the maximum photocurrent, such that all pixels in the array have a shutter efficiency of greater than about 100 dB.

In embodiments with a wide flat region in the photocurrent-voltage curve, the device is engineered by the appropriate choice of electrodes and interfacial materials. Referring to the layers in FIG. 3, in embodiments where material '8' and material '2,' the two layers interfacing with the light absorbing layer material '4,' are metals, both electrons and holes can be easily collected at each electrode. This is shown schematically in FIGS. 8A-8C, which shows energy band diagrams for such an embodiment. The materials in FIGS. 8A-8C are labeled to correspond with those in FIG. 3.

Figure 8A:
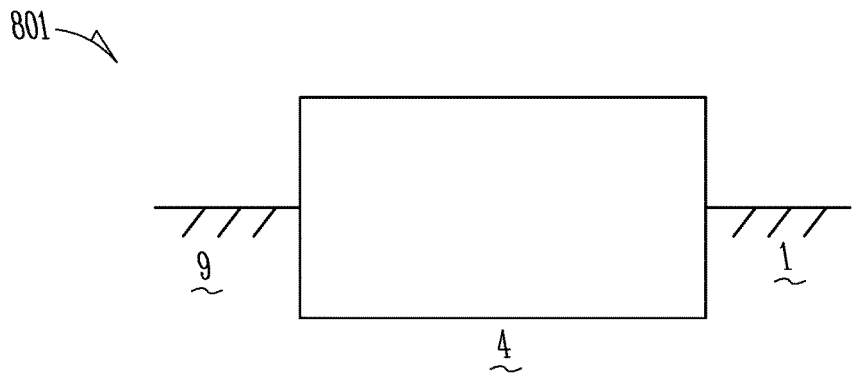
FIGS. 8A through 8C shows energy band diagrams for various embodiments.
Figure 8B:
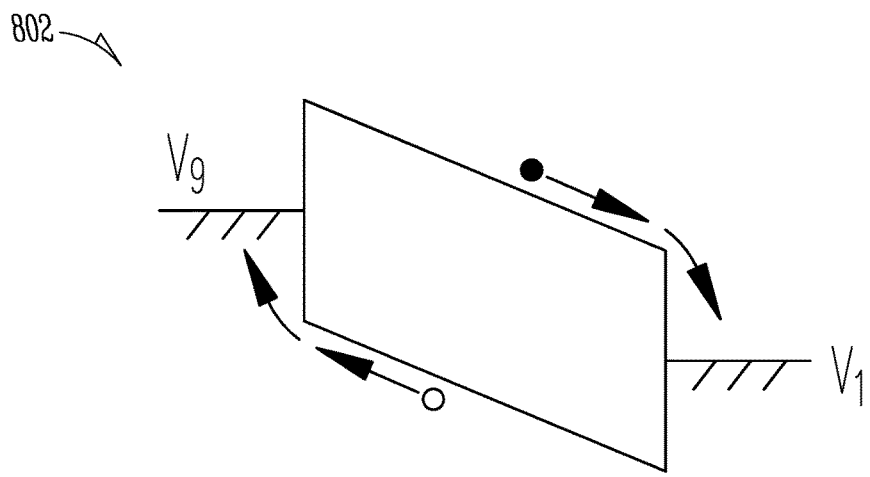
Figure 8C:
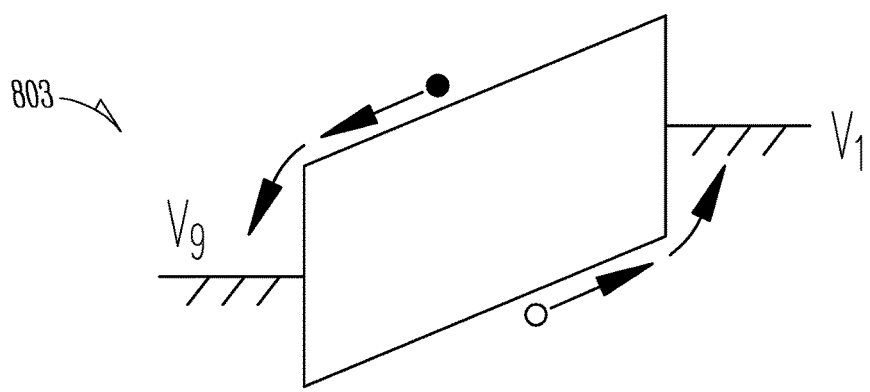

The energy band diagram 801 of FIG. 8A shows an embodiment in equilibrium (under zero applied bias). The energy band diagram 802 of FIG. 8B shows an embodiment biased to be "on" ($V_1>V_9$) such that electrons are collected at material '1' and holes at material '9.' The energy band diagram 803 of FIG. 8-03 shows an embodiment biased such that electrons will be collected at material '9' and holes at material '1' ($V_1<V_9$). In such embodiments, the photocurrent versus voltage characteristics will resemble those of curve B in FIG. 7, which shows no flat region. Such an embodiment can show good shutter efficiency for all pixels when paired with a readout circuit in which the pixel voltage does not change as photocurrent is collected. In embodiments where the pixel voltage does change as photo current is collected, such an embodiment will show good shutter efficiency in global shutter operation for low dynamic range images, such that all the pixels in the image have similar voltages.

Figure 6:
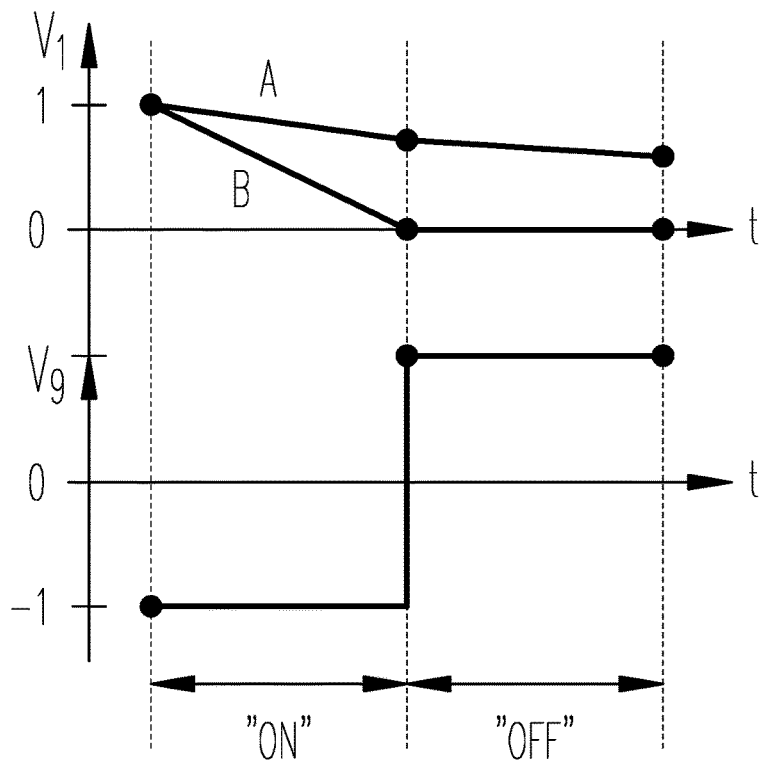
FIG. 6 shows a graph of an embodiment having a high shutter efficiency in global shutter mode even for high dynamic range images where there is a large difference in the voltages of the pixels in the array.

In embodiments where material '2' of FIG. 3 is a good hole blocker, the photocurrent voltage curve can achieve a wide flat region, such as is shown by curve A in FIG. 7. Such an embodiment can have a high shutter efficiency in global shutter mode even for high dynamic range images where there is a large difference in the voltages of the pixels in the array. This is illustrated in FIG. 6, which shows the voltages of material '1' and material '9' versus time for two pixels under different illumination conditions. Materials '1' and '9' in FIG. 6 are labeled to correspond to the same layers in FIG. 3. The "off" phase voltage of material '9' can be chosen to match the highest possible voltage for a pixel; in this example embodiment, about 1.0 V. Now when the device is turned "off" at the end of the "on" period, there is a bias for both pixels A and B that will drive photogenerated holes toward material '1.' The bias across pixel A is $\Delta V_A=V_{1A}-V_9$=0.75 V−1.0 V=−0.25 V, and the bias across pixel B is $\Delta V_B=V_{1B}-V_9$=0 V−1.0 V=−1.0 V. However, if the flat region of the photocurrent versus voltage curve extends all the way to $\Delta V$=−1.0 V, then there will be very little hole collection at material '1' of both pixels A and B, in spite of the bias. Thus the wide flat region enables pixels in a high dynamic range image to all be "off."

Figure 9A:
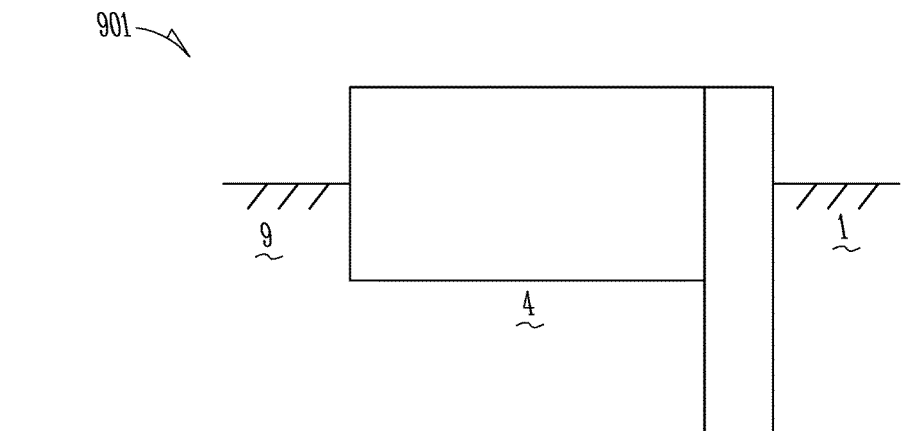
FIGS. 9A through 9C show energy band diagrams for an embodiment where a material is a good hole blocker.
Figure 9B:
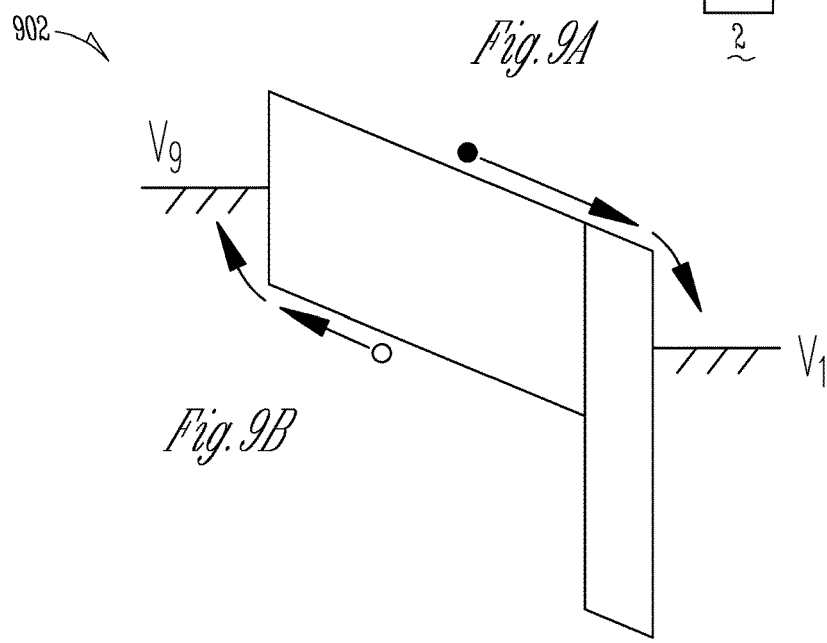
Figure 9C:
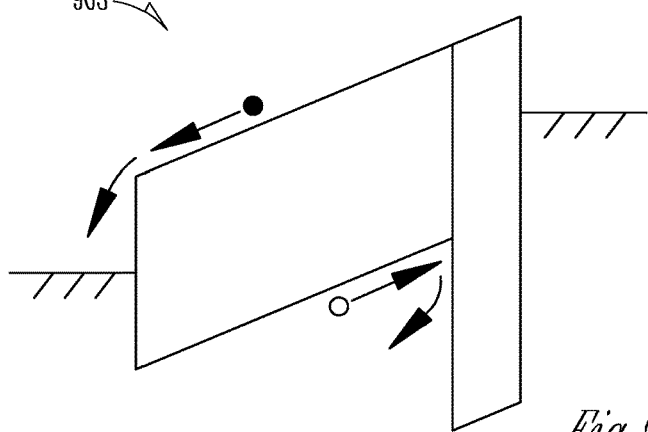

FIGS. 9A-9C show energy band diagrams for an embodiment where material '2' is a good hole blocker. The layers in FIG. 9 are labeled to correspond to those in FIG. 3. The energy band diagram 901 of FIG. 9A shows an embodiment in equilibrium. The energy band diagram 902 of FIG. 9B shows an embodiment biased such that is it "on" and electrons are collected at material '1.' The energy band diagram 903 FIG. 9C shows an embodiment biased such that it is "off," and neither electrons nor holes are collected at material '1.'

Figure 10:
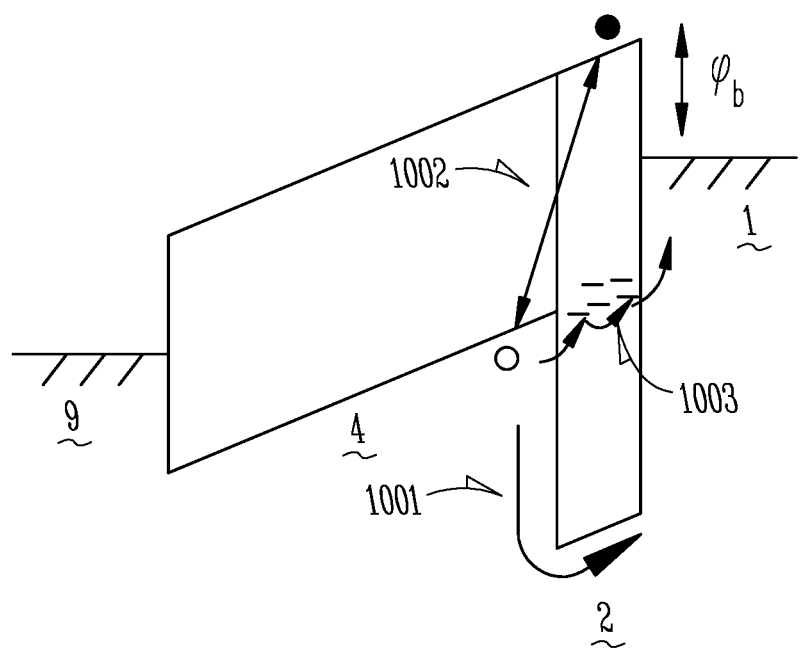
FIG. 10 shows three mechanisms for hole transfer through a material.

In embodiments, a wide flat region can be obtained because material '2' is an impediment to hole collection at material '1.' In such embodiments, there can be three mechanisms for hole transfer through material '2,' when a bias is applied such that holes are driven toward material '1.' Embodiments of these three mechanisms are illustrated in FIG. 10 (1001, 1002, 1003). In embodiments with a high global shutter efficiency, it is desirable for all three mechanisms to be as slow as possible. The layers in FIG. 10 ('1,' '2,' '4,' '9') are labeled to correspond to those in FIG. 3, and are biased with $V_1<V_9$, such that there is a driving force for hole collection at material '1.'

With continued reference to FIG. 10, mechanism 1001 is the thermionic emission of holes into the valence band of the hole blocking layer, material '2.' If the valence band edge is much deeper than the valence band edge of the light absorbing layer, material '4,' then this mechanism for hole transfer can be very slow. This is illustrated in FIG. 10, which shows a large valence band edge offset between material '4' and material '2.' In such embodiments, the flat region of the photocurrent voltage curve can be very wide.

In FIG. 10, in mechanism 1002 holes are collected through material '2' by recombination with electrons in material '2.' If there are very few electrons in the conduction band of material '2,' then this process can be slow. In such embodiments material '2' is an effective hole blocker, and the photocurrent versus voltage curve can have a wide flat region. The electrons in material '2' can come from two sources. Firstly, if material '2' is n-type doped, there is a readily available equilibrium population of electrons in its conduction band, which can recombine with the photogenerated holes in material '4.' Thus in embodiments, a good hole blocker can be fully depleted, such that the electron density in its conduction band is low. In order to be fully depleted, material '2' can be either thin, or lightly doped. For example, if material '2' is 10 nm thick, then it can have a free electron density of less than $1\times10^{19}$ cm$^{-3}$. Secondly, the electrons in the conduction band of material '2' can be injected from material '1.' The rate of such injection is controlled by the energy difference between the work function of material '1,' and the conduction band edge of material '2.' This is given by $\varphi_b$ in FIG. 10, and the rate of injection will be governed by thermionic emission or Fowler-Nordheim tunneling, depending on the energy barrier and the local electric field. If this energy barrier is large, this mechanism can be slow, and material '2' can be an effective hole blocker. In such embodiments, the photocurrent versus voltage curve can have a wide flat region.

In such embodiments, the work function of material '1' can be greater than about 4.5 eV below vacuum, in order to make the barrier for injection of electrons ($\varphi_b$ in FIG. 10) large.

With continued reference to FIG. 10, in mechanism 1003, holes are conducted through material '2,' via a continuous band of occupied traps. In embodiments of this mechanism, hole traps are close in space and close in energy, such that holes can hop from trap-to-trap through the entire thickness of this film. If material '2' does not have very many traps, or if these traps are highly delocalized in energy, or if the thickness of material '2' is large enough, then the hopping of holes through the traps can be very slow, and material '2' can be an effective hole blocker. In such embodiments, the photocurrent versus voltage curve can have a wide flat region.

In embodiments with an effective hole blocker, all three of these mechanisms 1001, 1002, 1003 can be slow. In embodiments, "slow" is determined by the intensity of light incident upon the device. If the shutter efficiency is to exceed about 100 dB, then the rate of hole transfer through material '2' must be about 100 dB less than the rate of photon incidence upon the device. For example, if a light intensity equivalent to 5440 photons/s is incident on the device, then one photon is transported through material '4' to the interface with material '2' every approximately 18 μs. For the shutter efficiency to exceed about 100 dB, the time for hole extraction through material '2' must be greater than 10^(100/20)*18 μs, which is greater than about 18 s. If the light intensity is higher than this, then the requirement for good shutter efficiency is relaxed.

For example, if a light intensity equivalent to 544,000 photons/s is incident on the device, then the time for hole extraction must be greater than 0.18 s in order to have a shutter efficiency greater than 100 dB. In such embodiments, the time for hole extraction for all three mechanisms (1001, 1002, 1003) independently can be greater than this time to achieve such shutter efficiencies.

In embodiments where material '1' is patterned into individual pixels to form an imaging array, the hole blocking material '2' can also be patterned into pixels. This is particularly important if the conductivity of material '2' is high enough to short the pixels together. In embodiments, the patterning of material '2' into individual pixels can be accomplished by masking and lithography as known to a person of ordinary skill in the art. In embodiments, it can be accomplished by forming material '2' from a previously patterned layer, for example, by the oxidation of previously patterned TiN to form $TiO_2$ or $TiO_xN_y$.

In embodiments where material '2' is a good hole blocker, it can simultaneously be a good conductor of electrons. This can allow the device to easily collect electrons at material '1' during the "on" phase of operation. In embodiments where there is rapid electron conduction, the conduction band of material '2' can be close to or lower than the conduction band of the light absorbing layer, material '4.' In such embodiments, there is no energy barrier for electron transmission through material '2.' In embodiments the electron mobility of material '2' can be high (e.g., greater than $1 \times 10^{-3}$ cm$^2$/V-s), providing for the rapid conduction of electrons through material '2.'

The following is a list of characteristics a good hole blocking material (material '2') can have in such embodiments:
  conduction band edge about 0.5 eV above or below the conduction band edge of material '4';
  band gap energy greater than or the band gap energy of material '4';
  free electron density less than about $1 \times 10^{19}$ cm$^{-3}$;
  electron mobility greater than about $1 \times 10^{-5}$ cm$^2$/V-s;
  film thickness of about 5 nm to about 100 nm; and
  hole trap density less than about $1 \times 10^{19}$ cm$^{-3}$.

In an example embodiment when the conduction band edge of material '4' is about 4.0 eV below the vacuum level and the band gap of material '4' is about 1.5 eV, a good hole blocking layer (material '2') can have:
  conduction band edge about 3.5 eV to about 4.5 eV below the vacuum level;
  band gap energy greater than about 2.0 eV;
  free electron density less than about $1 \times 10^{17}$ cm$^{-3}$;
  electron mobility greater than about $1 \times 10^{-3}$ cm$^2$/V-s;
  film thickness of about 5 nm to about 20 nm; and
  hole trap density less than about $1 \times 10^{17}$ cm$^{-3}$.

In embodiments, material '2' can be a very wide band gap semiconductor or insulator, such that from a band diagram perspective, it is a good hole blocker and also an electron blocker. In such embodiments, a wide flat region can be achieved by the hole blocking properties as described above. In such embodiments, material '2' can still be a good conductor of electrons, such that the photocurrent collection when the device is "on" is very efficient. Good conduction of electrons can happen by several different mechanisms. In some embodiments, good conduction of electrons though a wide band gap insulator can be accomplished by tunneling under a large electric field. When the device is in the "on" state, the applied bias across the device can be greater than about 1 V. The electric field driving tunneling of electrons through material '2' can be approximately found by dividing the applied bias by the total thickness of material '2,' and material '4,' and can be greater than about $1 \times 10^4$ V/cm. By contrast, when the device is "off," the applied bas across the device can be less than about 1 V. The electric field driving tunneling of electrons or holes to through material '2' can be less than about $1 \times 10^4$ V/cm. In such embodiments, the tunneling rate of electrons and holes through material '2' can be very different under different electric fields, such that the device can have a global shutter efficiency greater than about 100 dB.

In embodiments where material '2' is a very wide band gap semiconductor or insulator, good conduction of electrons through material '2' can occur by rapid tunneling or hopping through material '2' even under small electric fields. In embodiments, tunneling of electrons through material '2' can be fast for low thicknesses of material '2,' for example, less than about 3 nm. In other embodiments, transport of electrons through material '2' can be aided by electron hopping through a distribution of trap states. In such embodiments, the conduction of electrons through material '2' can be very efficient, even if the band diagram shows a large conduction band offset that would otherwise inhibit electron conduction. In such embodiments, the conduction of holes through material '2' can still be very slow, such that material '2' is a good hole blocker, and the device can have a global shutter efficiency greater than about 100 dB.

In embodiments when material '2' is a hole blocker, it can be a deposited layer, and can include oxides, nitrides, sulfides or oxynitrides of aluminum, gallium, indium, tin, lead, bismuth magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can include oxides, nitrides, or oxynitrides of metals used in standard CMOS such as aluminum, tungsten, tantalum, titanium, copper. In embodiments, these oxides can be sub-stoichiometric, such that they are somewhat oxygen deficient, such as $TiO_{2-x}$.

In embodiments, when material '2' is a hole blocker, it can be deposited by atomic layer deposition, sputter deposition, pulsed laser deposition, chemical vapor deposition, plasma enhanced chemical vapor deposition, thermal evaporation, electron beam evaporation, or by solution processing techniques, such as spin coating, dip coating, doctor blading, slot-die coating, electrochemical deposition.

In embodiments, when material '2' is a hole blocker, it can be a layer formed from the surface of a metal, and can include oxides, nitrides, sulfides or oxynitrides of aluminum, gallium, indium, tin, lead, bismuth magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can include oxides, nitrides, or oxynitrides of metals used in standard CMOS such as aluminum, tungsten, tantalum, titanium, copper.

In embodiments, when material '2' is a hole blocker, it can be a semiconducting polymer, including functionalized conjugated groups including, thiophenes, carbazoles, vinylenes, azides, isoindigos, such as P3HT, MEH-PPV, PCDTBT, F8TB.

In embodiments, when material '2' is a hole blocker, it can be a semiconducting organic small molecule, such as Alq3, BCP, Spiro-OMeTAD, CuPc.

In embodiments, when material '2' is a hole blocker, it can be a metal-organic perovskite, such as those containing metal halides. These can include, methyl ammonium lead iodide, methyl ammonium lead chloride, methyl ammonium tin iodide.

In embodiments, an electron blocking layer can enhance the ability of the hole blocking layer to improve global shutter efficiency. Whereas a hole blocking layer can be added as material '2' to slow the extraction of holes toward material '1,' an electron blocking layer can be added as material '8' to slow the extraction of electrons toward material '9.' In embodiments, the global shutter efficiency can be higher if the rate of carrier extraction at material '1' is equal to that at material '9' when the device is in the "off" state. In such embodiments there can be no buildup of charge due to unequal extraction of electrons and holes from the device on short time scales. In embodiments where the device is rapidly toggled between the "on" and "off" states, a device with no buildup of charge have better lag and hysteresis than one with a large buildup of net charge. An electron blocker can have properties analogous to a hole blocker, except that the electron blocker can slow the collection of electrons at material '9' while permitting the rapid collection of holes at material '9.'

In embodiments, an electron blocker can have the following properties:
  valence band edge of about 0.5 eV above or below the valence band edge of material '4';
  band gap energy greater than or the band gap energy of material '4';
  free hole density less than about $1\times10^{19}$ cm$^{-3}$;
  hole mobility greater than about $1\times10^{-5}$ cm$^2$/V-s;
  film thickness of about 5 nm to about 100 nm; and
  electron trap density less than about $1\times10^{19}$ cm$^{-3}$.

In an example embodiment, when the valence band edge of material '4' is about 5.2 eV below the vacuum level and the band gap of material '4' is about 1.5 eV, a good electron blocking layer (material '8') can have:
  valence band edge of about 4.7 to about 5.7 eV below vacuum
  band gap energy greater than about 2 eV;
  free hole density less than about $1\times10^{17}$ cm$^{-3}$;
  hole mobility greater than about $1\times10^{-3}$ cm$^2$/V-s;
  film thickness of about 5 nm to about 20 nm; and
  electron trap density less than about $1\times10^{17}$ cm$^{-3}$.

In embodiments, when material '8' is an electron blocker, it can be a deposited layer, and can include oxides, nitrides, sulfides or oxynitrides of aluminum, gallium, indium, tin, lead, bismuth magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can include oxides, nitrides, or oxynitrides of metals used in standard CMOS such as aluminum, tungsten, tantalum, titanium, copper. In embodiments, these oxides can be sub-stoichiometric, such that they are somewhat oxygen deficient, such as $TiO_{2-x}$.

In embodiments, when material '8' is an electron blocker, it can be deposited by atomic layer deposition, sputter deposition, pulsed laser deposition, chemical vapor deposition, plasma enhanced chemical vapor deposition, thermal evaporation, electron beam evaporation, or by solution processing techniques, such as spin coating, dip coating, doctor blading, slot-die coating, electrochemical deposition, and/or other techniques known to a person of ordinary skill in the art.

In embodiments, when material '8' is an electron blocker, it can be a layer formed from the surface of a metal, and can include oxides, nitrides, sulfides or oxynitrides of aluminum, gallium, indium, tin, lead, bismuth magnesium, calcium, zinc, molybdenum, titanium, vanadium, lanthanum, chromium, manganese, iron, cobalt, nickel, copper, zirconium, niobium, palladium, silver, hafnium, tantalum, tungsten, iridium, platinum, gold. In embodiments, it can include oxides, nitrides, or oxynitrides of metals used in standard CMOS such as aluminum, tungsten, tantalum, titanium, copper.

In embodiments, when material '8' is an electron blocker, it can be a semiconducting polymer, including functionalized conjugated groups including, thiophenes, carbazoles, vinylenes, azides, isoindigos, such as P3HT, MEH-PPV, PCDTBT, F8TB.

In embodiments, when material '8' is an electron blocker, it can be a semiconducting organic small molecule, such as Alq3, BCP, Spiro-OMeTAD, CuPc.

In embodiments, when material '8' is an electron blocker, it can be a metal-organic perovskite, such as those containing metal halides. These can include, methyl ammonium lead iodide, methyl ammonium lead chloride, methyl ammonium tin iodide.

In embodiments, the device operates such that on the "on" state electrons are collected at material '1' and holes are collected at material '9.' In such embodiments, material '2' can be a hole blocker and material '8' can be an electron blocker. In other embodiments the device operation can be reversed, such that in the "on" state holes are collected at material '1' and electrons are collected at material '9.' In such embodiments, material '2' can be an electron blocker and material '8' can be a hole blocker. In such embodiments, the device can achieve a global shutter efficiency can be greater than about 100 dB.

In embodiments, the toggling of the voltage of material '9' (e.g., referring to the stack in FIG. 3) to turn the device from the "on" state to the "off" state, or vice versa, can couple some of the voltage to material '1.' The amount of voltage coupled from material '9' to material '1' can depend on the relative capacitance of the stack shown in FIG. 3, and the capacitance of the rest of the readout circuit. In embodiments where the readout of the photocurrent signal does not depend on the voltage of material '1,' this coupling may not affect the signal. In embodiments where the readout of the photocurrent depends on the voltage of material '1,' such as the example given in FIG. 5, this coupling can affect the readout signal.

In embodiments where the coupling of the voltages of materials '9' and '1' is about identical when the device is toggled from "on" to "off" as when it is toggled from "off" to "on," there can be no effect on the readout signal. This is because the device can be toggled from "off" to "on" and back to "off" again before readout, thus completely undoing the effect of the coupling.

In embodiments where the capacitance of one or more of the layers in the stack of FIG. 3 changes with, for example, time, bias, or light exposure, the amount of voltage coupled between material '9' and material '1' can be different when the device is toggled from "on" to "off" than when it is toggled from "off" to "on." In embodiments where the readout photocurrent depends on the voltage of material '1,' this can cause an imaging artifact or non-linearity. In such embodiments, the imaging artifact can be mitigated by making the capacitance of the readout circuit much greater than the capacitance of the stack in FIG. 3. In such embodiments, the voltage coupling from material '9' to material '1' can be largely independent of the capacitance of the stack in FIG. 3. In such embodiments, even if the capacitance of the stack in FIG. 3 changes with time, bias, or light exposure, it will not affect the readout signal.

In embodiments where the readout of the photocurrent depends on the voltage of material '1,' an imaging artifact due to the coupling of voltage from material '9' to material '1' can be mitigated by minimizing or reducing the change of the capacitance of the all the materials in the stack of FIG. 3 with, for example, time, bias, or light exposure. In order to minimize such a change in capacitance, the extraction of both electrons and holes from the materials stack can be very fast, such that there is no buildup of charge in the stack. In such embodiments, the electron and hole mobilities of each of the materials in FIG. 3 can be greater than about $1 \times 10^{-4}$ cm$^2$/V-s. In such embodiments, there can be no energetic barriers for the extraction of electrons and holes, such as an offset of conduction or valence band energies between two adjacent materials. In such embodiments, the coupling of voltage from material '9' to material '1' can be the same when the device is toggled from "on" to "off" as it is when toggled from "off" to "on," such that there is no imaging artifact introduced by the coupling.

In embodiments, time-lag related imaging artifacts can occur when carrier trapping in any of the stack materials is significant. In embodiments, electrons or holes can become deeply trapped in the device under illumination, and de-trap at a later time, producing an after-image or lag artifact. In embodiments, the after-image can appear as a positive after-image (a faint copy of earlier frames) or a negative after-image (an inverse-intensity copy of earlier frames, where formerly bright areas appear dark and formerly dark areas appear bright). In embodiments, carrier trapping can occur to different degrees depending on the bias applied to the device. In embodiments where the device is operating in global shutter mode, such that the device is toggling between "on" and "off" states, the after-image can look discretized and highly localized in space. For example, in embodiments where carriers become trapped when the device is in the "off" state, the after image can be generated for pixels that are in the "off" state when a bright light was shined on them. In other embodiments, where carriers become trapped when the device is in the "on" state, the after image can be generated for pixel that are in the "on" state when a bright light was shined on them, while other pixels may produce no after image.

In embodiments, time-lag imaging artifacts can be minimized by reducing the number or depth of traps in all the materials in the stack (e.g., material '2,' material '4,' material '9'). The number of traps can be reduced by obtaining high quality and pure materials, and by processing the materials in a way that minimizes or reduces inclusions, voids, dangling bonds, and/or the area of hetero-interfaces.

In various embodiments, an electronic device comprises, for example, at least one photosensitive layer and at least one carrier selective layer. Under one range of biases on the device, the photosensitive layer produces a photocurrent while illuminated. Under another range of biases on the device, the photosensitive does not produce a photocurrent while illuminated. A carrier selective layer expands the range of biases over which the photosensitive layer does not produce any photocurrent while illuminated.

In various embodiments, an electronic device comprises, for example, at least one photosensitive layer and at least one carrier selective layer. Under a first range of biases on the device, the photosensitive layer is configured to collect a photocurrent while illuminated. Under a second range of biases on the device, the photosensitive layer is configured to collect at least M times lower photocurrent while illuminated compared to under the first range of biases.

In various embodiments of the electronic device, the at least one carrier selective layer is configured to expand the voltage range corresponding to the second range of biases. In various embodiments of an electronic device, the first range of biases is to exceed about 1 volt.

In various embodiments of the electronic device, the second range of biases is to exceed about 1 volt.

In various embodiments of the electronic device, M is greater than about 100.

In various embodiments of the electronic device, M is greater than about 1,000.

In various embodiments of the electronic device, M is greater than about 10,000.

In various embodiments of the electronic device, M is greater than about 100,000.

In various embodiments of the electronic device, the at least one carrier selective layer is configured to, under the first range of biases, collect electrons. The at least one carrier selective layer, under the second range of biases, is configured to collect holes.

In various embodiments of the electronic device, the at least one carrier selective layer is configured to, under the first range of biases, collect holes. The at least one carrier selective layer is configured to, under the second range of biases, collect electrons.

In various embodiments of the electronic device, under a range of illumination levels, an electrical bias across the electronic device remains substantially unchanged across an entire integration time. In various embodiments of the electronic device, the electrical bias change is less than about 0.2 volts. In various embodiments of the electronic device, the range of illumination levels spans a range of about 0 lux to about 10 lux on pixel.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list, and any combination of the items in the list.

The above description of embodiments is not intended to be exhaustive or to limit the systems and methods to the precise forms disclosed. While specific embodiments of, and examples for, the embodiments are described herein for illustrative purposes, various equivalent modifications are possible within the scope of the systems and methods, as those skilled in the relevant art will recognize. The teachings of the embodiments provided herein can be applied to other systems and methods, not only for the systems and methods described above.

The elements and acts of the various embodiments described above can be combined to provide further embodiments. These and other changes can be made to the embodiments in light of the above detailed description.

What is claimed is:

1. An electronic device, comprising:
   at least one photosensitive layer; and
   at least one carrier selective layer;
   wherein, under a first range of biases on the electronic device, the at least one photosensitive layer is configured to collect a photocurrent while illuminated;
   wherein, under a second range of biases on the electronic device, the at least one photosensitive layer is configured to collect at least M times lower photocurrent while illuminated compared to under the first range of biases, wherein M=100; and
   wherein the at least one carrier selective layer includes one layer that is configured to collect electrons under the first range of biases and to collect holes under the second range of biases.

2. The electronic device of claim 1, wherein the at least one carrier selective layer is configured to expand a voltage range corresponding to the second range of biases.

3. The electronic device of claim 1, wherein the first range of biases is to exceed about 1 volt.

4. The electronic device of claim 1, wherein the second range of biases is less than about 1 volt.

5. The electronic device of claim 1, wherein M is greater than about 1,000.

6. The electronic device of claim 1, wherein M is greater than about 10,000.

7. The electronic device of claim 1, wherein M is greater than about 100,000.

8. The electronic device of claim 1, wherein, under a range of illumination levels, an electrical bias across the electronic device remains substantially unchanged across an entire integration time.

9. The electronic device of claim 8, wherein the electrical bias changes by less than about 0.2 volts.

10. The electronic device of claim 8, wherein the range of illumination levels spans a range of about 0 lux to about 10 lux on pixel.

11. The electronic device of claim 1, wherein another one of the at least one carrier selective layer is configured to collect electrons under the second range of biases.

* * * * *